US008446305B1

(12) United States Patent
Zanoni et al.

(10) Patent No.: US 8,446,305 B1
(45) Date of Patent: May 21, 2013

(54) PHOTONIC ANALOG TO DIGITAL CONVERSION

(75) Inventors: Raymond Zanoni, Columbia, MD (US); Alistair J. Price, Ellicott City, MD (US); Peter J. Morgan, Glenelg, MD (US); Phillip R. Koenig, Martelle, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 715 days.

(21) Appl. No.: 12/571,232

(22) Filed: Sep. 30, 2009

(51) Int. Cl.
*H03M 1/00* (2006.01)

(52) U.S. Cl.
USPC .......................................... 341/137; 341/155

(58) Field of Classification Search .................. 341/137, 341/144, 155
See application file for complete search history.

(56) References Cited

U.S. PATENT DOCUMENTS

| | | | | |
|---|---|---|---|---|
| 6,326,910 | B1 * | 12/2001 | Hayduk et al. | 341/137 |
| 6,525,682 | B2 * | 2/2003 | Yap et al. | 341/137 |
| 7,212,140 | B2 * | 5/2007 | Soderberg et al. | 341/137 |
| 2006/0164271 | A1 * | 7/2006 | Hirt et al. | 341/143 |
| 2007/0159369 | A1 * | 7/2007 | Currie et al. | 341/144 |

OTHER PUBLICATIONS

"AVR121: Enhancing ADC resolution by oversampling." 8-bit AVR Microcontrollers Application Note, Rev. 8003A-AVR-09/05, Amtel Corporation, 2005.

Asuri, B., et al., "Time-stretched ADC arrays," IEEE Transactions on Circuits and Systems—II: Analog and Digital Signal Processing, vol. 49, No. 7, pp. 521-524, 2002.
Bell, J. A. et al. "A/D conversion of microwave signals using a hybrid optical/electronic technique," Optical Technology for Microwave Applications V, SPIE vol. 1476, pp. 326-329, 1991.
Bell, J. A., et al., "Optical sampling and demultiplexing applied to A/D conversion," SPIE vol. 1562: 276-280, 1991.
Bhushan, A. S., "30 Gsample/s 4-bit time-stretch analog-to-digital converter," CLEO, CFM1, pp. 623-624, 2000.
Bhushan, A. S., et al., "130 Gsample/s photonic analog to digital converter," IEEE, W-2.2, pp. 185, 187, and 189, 2001.
Bhushan, A. S., et al., "130-GSa/s photonic analog-to-digital converter with time stretch preprocessor," IEEE Photonics Tech. Letters, vol. 14, No. 5, pp. 684 and 686, 2002.
Bhushan, A. S., et al., "150 Gsample/s wavelength division sampler with time-stretched output," IEEE Electronics Letters, Dec. 23, 1997.
Bhushan, A. S., et al., "Photonic sampling and time stretching for analog-to-digital conversion," Advanced A/D and D/A conversion techniques and their Applications, Jul. 27-28, 1999 Conference Publication No. 466.
Bhushan, A. S., et al., "Time-stretched analogue-to-digital conversion," IEEE Electronics Letters, vol. 34, No. 9, pp. 839-841, 1998.

(Continued)

*Primary Examiner* — Jean B Jeanglaude
(74) *Attorney, Agent, or Firm* — Donna P. Suchy; Daniel M. Barbieri

(57) ABSTRACT

A photonic analog to digital converter includes one or more modulators configured to receive a first optical signal and a radio frequency signal. The one or more modulators is configured to modulate the first optical signal based on the radio frequency signal. The converter also includes circuitry configured to independently quantize one or more of phase, quadrature, and amplitude coordinates of the modulated signal. The circuitry provides the quantized coordinates to one or more electronic analog to digital converters.

23 Claims, 13 Drawing Sheets

OTHER PUBLICATIONS

Boyraz, O., et al., "Broadband, high-brightness 10-Gbit/s supercontinuum source for A/D conversion," CLEO, pp. 489-490, 2000.
Boyraz, O., et al., "Optical header extraction and recognition by discrete time stretch technique," IEEE, pp. 63-65, 2004.
Boyraz, O., et al., "Time stretch optical header recognition," IEEE, pp. 543-544, 2003.
Brannon, B., et al., "Aperture uncertainty and ADC system performance," AN-501, Application Note, Analog Devices, Inc. pp. 1-4, 2006.
Chou, J., et al., "150 GS/s real-time oscilloscope using a photonic front end," Microwave Photonics, 2008, Jointly held with the 2008 Asia-Pacific Microwave Photonics Conference. MWP/APMP 2008, International Topics Meeting on Microwave Photonics, Sep. 9, 2008-Oct. 3, 2008, pp. 35-38.
Chou, J., et al., "Femtosecond real-time single-shot digitizer," Applied Physics Letters 91, 161105-1-3, 2007.
Clark, Jr., T. R., "High-performance photonic analog-to-digital converters," WV1-1, IEEE.
Clark, T. R., "Coherent optical phase-modulation link," IEEE Photonics Tech. Letters, vol. 19, No. 16, 2007, pp. 1206-1208.
Clark, T. R., at al., "Performance of a time- and wavelength-interleaved photonic sampler for analog-to-digital conversion," IEEE Photonics Tech. Letters, vol. 11, No. 9, pp. 1168-1170, 1999.
Clark, T. R., et al., "Time- and wavelength-interweaved photonic sampler for analog-to-digital conversion," CTuN3 CLEO 1999, pp. 169-170.
Coppinger, F., et al., "Time-stretched analog-to-digital conversion (TSADC)," CLEO, CTuN2, pp. 168-169, 1999.
Currie, M., "High-speed, photonic analog-to-digital conversion using phase modulation," CLEO, CMN6, pp. 68, 2001.
Daryoush, A. S., et al., "All-optical ADC and its application in future communication satellites," IEEE, TC-1, pp. 182-185, 2004.
Eliyahu, D., et al., "Modulation response (S21) of the coupled opto electronic oscillator," Proceedings of the 2005 IEEE Intl. Frequency control Symposium and Expo., pp. 850-858, 2005.
Eliyahu, D., et al., "Phase noise of a high performance OEO and an ultra low noise floor cross-correlation microwave photonic homodyne system," Frequency Control Symposium, IEEE Intl., May 19-21, 2008, pp. 811-814.
Gee, S., et al., "Attosecond timing jitter actively modelocked semiconductor fiber ring laser with normal net cavity dispersion," CMKK4 OSA/CLEO, 2007.
Grein, M.E., Observation of quantum-limited timing jitter in an active, harmonically mode-locked fiber laser, Optics Letters, vol. 27, No. 11, pp. 957-959, 2002.
Gunn, G., et al., "A low phase noise 10GHz optoelectronic RF oscillator implemented using CMOS photonics," IEEE Intl. Solid State Circuits Conf., ISSCC 2007, pp. 570-571, 622, 2007.
Gupta, S., et al., "2nd order distortion cancellation in photonic time stretch analog-to-digital converter," IEEE, pp. 229-232, 2007.
Gupta, S., et al., Demonstration of distortion suppression in photonic time-stretch ADC using back propagation method, IEEE, pp. 141-144, 2007.
Gupta, S., et al., "Distortion cancellation in time-stretch analog-to-digital converter," J. Lightwave Tech., vol. 25, No. 12, pp. 3716-3721, 2007.
Gupta, S., et al., "Time-warp correction and calibration in photonic time-stretch analog-to-digital converter," Optical Letters, vol. 33, No, 22, pp. 2674-2676, 2008.
Han Y., et al., "Adaptive online calibration in time stretched ADC arrays," IEEE, Instrumentation and Measurement Technology Conf., Vail, CO, May 20-22, 2003, pp. 1212-1216.
Han, Y., et al., "480 GSample/s time stretch transient digitizer," IEEE Lightwave Technologies in Instrumentation and Measurement Conf., Palisades, NY, Oct. 19-20, 2004, pp. 49-53.
Han, Y., at al., "Continuous-time time-stretched analog-to-digital converter array implemented using virtual time gating," IEEE Transactions on Circuits and Systems-I: Regular Papers, vol. 52, No. 8, pp. 1502, 1504, 1506, 2005.
Han, Y., et al., "Differential photonic time-stretch analog-to-digital converter."
Han, Y., et al., "One tera-sample/sec real-time transient digitizer," IEEE, Instrumentation and Measurement Tech. Conf., Ottawa, CA, May 17-19, 2005, pp. 507-509.
Han, Y., et al., "Photonic time-stretched analog-to-digital converter: fundamental concepts and practical considerations," J. Lightwave Tech., vol. 21, No. 12, pp. 3085-3099, 3101, 3103, 2003.
Han, Y., et al., "Time-bandwidth product of the time stretched analog-to-digital converter," pp. 309-312.
Han, Y., et al., "Ultrawide-band photonic time-stretch A/D converter employing phase diversity," IEEE Transactions on Microwave Theory and Techniques, vol. 53, No. 4, pp. 1404-1408, 2005.
Helkey, R., et al., "A down-conversion optical link with RF gain," J. Lightwave Tech., vol. 15, No. 6, pp. 956-961, 1997.
Hou, X., et al., "Design of an ultra high-speed all-optical analog-to-digital converter," IEEE, pp. 521-523, 2004.
Hou, X., et al., "GSPS all-optical ADC for future communication and imaging," pp. 1-4.
Hou, X., et al., "Multi-GSPS all-optical ADC for direct digital receivers," IEEE, TH1B, pp. 475-478, 2006.
Jacobs, E. W., et al., "Optically clocked track-and-hold for high-speed high-resolution analog-to-digital conversion," IEEE, pp. 190-192, 2004.
Jalali, B., et al., "Phase diversity and continuous-time operation in time stretch A/D converter," IEEE, TuN1, pp. 268-269, 2004.
Jarrahi, M., et al., "Optical spatially quantized high performance analog-to-digital conversion," CWJ7, OSCA: 1-55752-834-9.
Jiang L. A., et al., "Quantum-limited noise performance of a mode-locked laser diode," Optics Letters, vol. 27, No. 1: pp. 49-51, 2002.
Johansson, L. A., "Time-sampled linear optical phase demodulation," Conference on Coherent Optical Tech. & Applications (CODA), CTuC2, 2008.
Johansson, L. A., et al., "Coherent optical receiver for linear optical phase demodulation," IEEE MTT-S Intl. Microwave Symposium, Jun. 2007.
Juodawlkis, P. W., et al., "Impact of photodetector nonlinearities on photonic analog to digital converters," CLEO 2002 Digest: 11-12, 2002.
Juodawlkis, P. W., et al., "Optical down-sampling of wide-band microwave signals," J. Lightwave Tech., vol. 21, No. 12: pp. 3116-3124, 2003.
Juodawlkis, P. W., et al., "Optically sampled analog-to-digital converters," IEEE Trans, Microwave Theory Tech., vol. 49, No. 10, pp. 1840-1853, 2001.
Kärtner, F. X., et al., "Electronic photonic integrated circuits for high speed, high resolution, analog-to-digital conversion," Proc. of SPIE vol. 6125, 612503-1-612503-14, 2006.
Kärtner, F. X., et al., "Silicon electronic photonic integrated circuits for high speed analog to digital conversion," IEEE, ThC3, pp. 203-205, 2006.
Kelkar, P. V., et al., "Effect of Mach-Zehnder Modulator's spectral response on the time-stretch analog-to-digital converter," CLEO, CMN3, pp. 65-66, 2001.
Kitayama, K., et al., "Photonic analog-to-digital conversion," IEEE, WC1.1, 2005, pp. 209-210.
Koch, B. R., et al., "Mode-locked and distributed feedback silicon evanescent lasers," Optics Express, vol. 15, No. 18, pp. 11225-11233, 2007.
Leonberger, F. J., et al., "Design and development of a high-speed electoopic A/D converter," IEEE Transactions on Circuits and Systems, vol. Cas-26, No. 12, pp. 1125-1131, 1979.
Li, W., et al., "All-optical analog-to-digital conversion based on polarization-differential interference and phase modulation," IEEE Photonics Tech. Letters, vol. 19, No. 8, pp. 625-627, 2007.
Liao, T. S., et al., "Pulse response of a high power waveguide optoelectronic switch for track and hold operation," IEEE, pp. 536-537, 2002.
McNeilage, C., et al., "A review of sapphire whispering gallery-mode oscillators including technical progress and future potential of the technology," UFFC, 2004.

Miyoshi, Y., et al., "All-optical analog-to-digital conversion using split-and-delay technique," J. Lightwave Tech., vol. 25, No. 6, pp. 1339-1347, 2007.

Nathawad, L., et al., "A 40-GHz bandwidth, 4-bit, time-interleaved A/D converter using photoconductive sampling," IEEE J. Solid-State Circuits, vol. 38, No. 12, pp. 2021-2030, 2003.

Nelson, C. W., et al., "Microwave Optoelectronic oscillator with optical gain," IEEE, pp. 1014-1019, 2007.

Ng, W., et al., "Characterization of the jitter in a mode-locked Er-Fiber laser and its application in photonic sampling for analog-to-digital conversion at 10 Gsample/s," J. Lightwave Tech., vol. 22, No. 8, pp. 1953-1961, 2004.

Nishitani, T. et al., "All-optical M-ary ASK signal demultiplexer based on a photonic analog-to-digital conversion," Optics Express, vol. 15, No. 25, 2007, 7 pgs.

Nishitani, T., et al., "All-optical analogue-to-digital conversion with bitwise signal allocation using a spatial coding method for 3bit grey code," IEEE Photonics in Switching Conference, 2006, 3 pgs.

Nishitani, T., et al., "Demonstration and evaluation of all-optical digital-to-analog conversion using pulse pattern recognition based on optical correlation processing," Optical Society of America, OFB5, 2005, 3 pgs.

Nuruzzaman, A., et al., "Time-stretched short-time Fourier transform," IEEE Transactions on Instrumentation and Measurement, vol. 55, No. 2, pp. 598-602, 2006.

Poulton, K., "Building the world's fastest 8-bit ADC—in CMOS," IEEE Intl. Microwave Symposium, 2005.

Poulton, K., "Time-interleaved SDCs, past and future," IEEE Intl. Solid States Circuit Cont., Feb. 10, 2009.

Rabiei, P., et al., "Hybrid opto-electronic WDM ADC," CLEO, pp. 628-629, 2000.

Saida, T., et al., "Optical pulse pattern recognition circuit based on an optical digital-to-analog converter on a planar lightwave circuit," Optical Society of America, 2000.

Salik, E., et al., "An ultralow phase noise coupled optoelectronic oscillator," IEEE Photon. Tech. Letters 19, pp. 444-446, 2007.

Sarantos, C., et al., "A photonic analog-to-digital converter based on an unbalanced Mach-Zehnder quantizer," IEEE, pp. 58-61, 2007.

Solli, D. R., et al., "Direct time-domain measurements of the pulse amplitude statistics of a fiber supercontinuum source," CMB3, OSA/CLEO, 2007.

Stigwell, J., et al., "Demonstration and analysis of a 40-Gigasample/s interferometric analog-to-digital converter," J. Lightwave Tech., vol. 24, No. 3, pp. 1247-1256, 2006.

Taylor, H. F., "An electrooptic analog-to-digital converter," IEEE 63: 1524-1525, 1975.

Taylor, H. F., "An optical analog to digital converter-design and analysis," IEEE Journal of Quantum Electronics, vol. QE-15, No. 4, Apr. 1979.

Twichell, J. C., "Photonic A/D converters," CLEO, CTuN1, pp. 168-169, 1999.

Twichell, J. C., et al., "Extending the performance of optically sampled time-demultiplexed analog-to-digital converters," CLEO, pp. 624-625, 2000.

Twichell, J. C., et al., "High-linearity 208-MS/s photonic analog-to-digital converter using 1-to-4 optical time-division demultiplexers," IEEE Photonic Tech. Letters, vol. 13, No. 7: 714-716, 2001.

Twichell, J.C., et al., "Phase-encoded optical sampling for analog-to-digital converters," IEEE Photon. Tech. Letters, vol. 12: pp. 1237-1239, 2000.

Urata, R., et al., "High-speed sample and hold using low temperature grown GaAs MSM switches for photonic A/D conversion," CLEO, CMN4, pp. 66-67, 2001.

Urata, R., et al., "Photonic A/D conversion using low-temperature-grown GaAs MSM switches integrated with Si-CMOS," J. Lightwave Tech., vol. 21, No. 12, pp. 3104-3115, 2003.

Urata, R., et al., "Ultrafast differential sample and hold using low temperature grown GaAs MSM for photonic A/D conversion," CLEO, CFM6, pp. 267-628, 2000.

Urata, R., et al., "Ultrafast sampling using low temperature growth GaAs MSM switches integrated with CMOS amplifier for photonic A/D conversion," IEEE, ThT4, pp. 809-810, 2002.

Valley, G. C., "Photonic analog-to-digital converters, a tutorial," OMI1, OSA/OFC/NFOEC 2009.

Valley, G. C., "Photonic analog-to-digital converters," Optics Express vol. 15, No. 5, Mar. 5, 2007.

Valley, G. C., et al., "Bandwidth compression optical processor using chirped fiber Bragg gratings," TuB6, OSA/PR, 2007.

Valley, G. C., et al., "Continuous time realization of time-stretch ADC.".

Walden, R. H., "Analog-to-digital conversion in the early 21st century," submitted for publication 2006.

Walden, R. H., "Analog-to-digital converter survey and analysis," IEEE J. Sel. Areas Comm., vol. 17, No. 4: pp. 539-550, 1999.

Williamson, R. C., et al., "Effects of crosstalk in demultiplexers for photonic analog-to-digital converters," J. Lightwave Tech., vol. 19, No. 2: 230-236, 2001.

Williamson, R.C., et al., "Precision calibration of an optically sampled analog-to-digital converter," Digest of IEEE LEOS Summer Topical Meeting on Photonic Time/Frequency Measurement and Control, pp. 22-23, 2003.

Wright, S., et al., "High-speed electro-optic analogue-digital conversion," Electronics Letters, vol. 10, No. 24, pp. 508-509, 1974.

* cited by examiner

PHOTONIC ANALOG TO DIGITAL CONVERSION

BACKGROUND

The present disclosure relates generally to the field of analog to digital conversion and more specifically to photonic analog to digital signal conversion.

Conventional military RF systems conventionally include wide bandwidth, high resolution Analog-to-Digital Converters (ADC) to enable use of, for example, wideband staring Signals Intelligence (SIGINT) receivers, flexible Software Defined Radio system architectures, and Lower Probability of Intercept/Lower Probability of Detection (LPI/LPD) radars. Conventional electronic ADC (eADC) performance may significantly limit the potential of such systems.

Optical or photonic ADCs (pADCs) were originally intended to advance the state of the art in analog to digital conversion, however conventional photonic ADC approaches have not been practical due to limitations such as size, weight, power consumption, poor Spurious-Free Dynamic Range (SFDR), fractions of continuous time, etc., making traditional eADCs more attractive and practical.

One conventional attempt at developing a pADC uses a mode locked laser to optically sample an RF signal that is applied to a parallel array of varying length mach-zehnder interferometers. Each interferometer is followed by a one bit electronic ADC to generate a digital code. Another conventional pADC approach uses temporal demultiplexing to reduce the sampling rate to a rate that electronic ADCs can digitize. Various conventional pADCs may achieve performances of about 10 ENOB at 505 MS/s, 3 ENOB @ 50 GHz as a transient digitizer at 10 TS/s of a 90 GHz waveform, 7 ENOB @ 10 GHz in a 2 channel system, and 3 ENOB @ 10 GHz at 150 GS/s with 4 channels. However, none of the pADC implementations to date have demonstrated practical chip-scale pADCs that can be used in the field.

Conventional electronic ADCs are a choke point in achieving multi-Gigabit rates in military and commercial receivers. The lack of availability of high-precision, high-speed ADCs limits the performance and has driven the complexity of receivers. The low-precision of conventional high-speed ADCs limits the dynamic range of the receiver.

What is needed is an ADC capable of simultaneously achieving high-dynamic range with high-data rates, allowing the receiver to capture and process high volumes of data in a highly dynamic spectral environment. What is also needed is a pADC having more practical size, weight, power consumption, SFDR, fractions of continuous time, etc. What is also needed is a more practical pADC having performance greater than that of eADCs. What is further needed is a pADC that is not inhibited by the clock jitter limitations of eADCs. What is still further needed is a pADC that can be used in RF communications systems.

SUMMARY

One exemplary embodiment of the disclosure relates to a photonic analog to digital converter. The converter includes one or more modulators configured to receive a first optical signal and a radio frequency signal. The one or more modulators is configured to modulate the first optical signal based on the radio frequency signal. The converter also includes circuitry configured to independently quantize one or more of phase, quadrature, and amplitude coordinates of the modulated signal. The circuitry provides the quantized coordinates to one or more electronic analog to digital converters.

Another exemplary embodiment of the disclosure relates to a photonic analog to digital converter system. The system includes one or more modulators configured to receive a first optical signal and a radio frequency signal. The one or more modulators is configured to modulate the first optical signal based on the radio frequency signal. The system also includes circuitry configured to independently quantize one or more of phase, quadrature, and amplitude coordinates of the modulated signal. The system also includes multiple electronic analog to digital converters for receiving the quantized coordinates from the circuitry and providing a digital signal output.

Another exemplary embodiment of the disclosure relates to circuitry for converting analog signals to digital signals. The circuitry includes means for receiving a first optical signal and a radio frequency signal and modulating the phase of the first optical signal based on the radio frequency signal. The circuitry also includes means for independently quantizing multiple dimensions of the modulated signal and means for electronically converting the quantized dimensions into a digital signal.

It is to be understood that both the foregoing general description and the following detailed description are exemplary and explanatory only, and are not restrictive of the invention as claimed.

BRIEF DESCRIPTION OF THE DRAWINGS

These and other features, aspects, and advantages of the present invention will become apparent from the following description, appended claims, and the accompanying exemplary embodiments shown in the drawings, which are briefly described below.

DETAILED DESCRIPTION OF THE EXEMPLARY EMBODIMENTS

Figure 1:
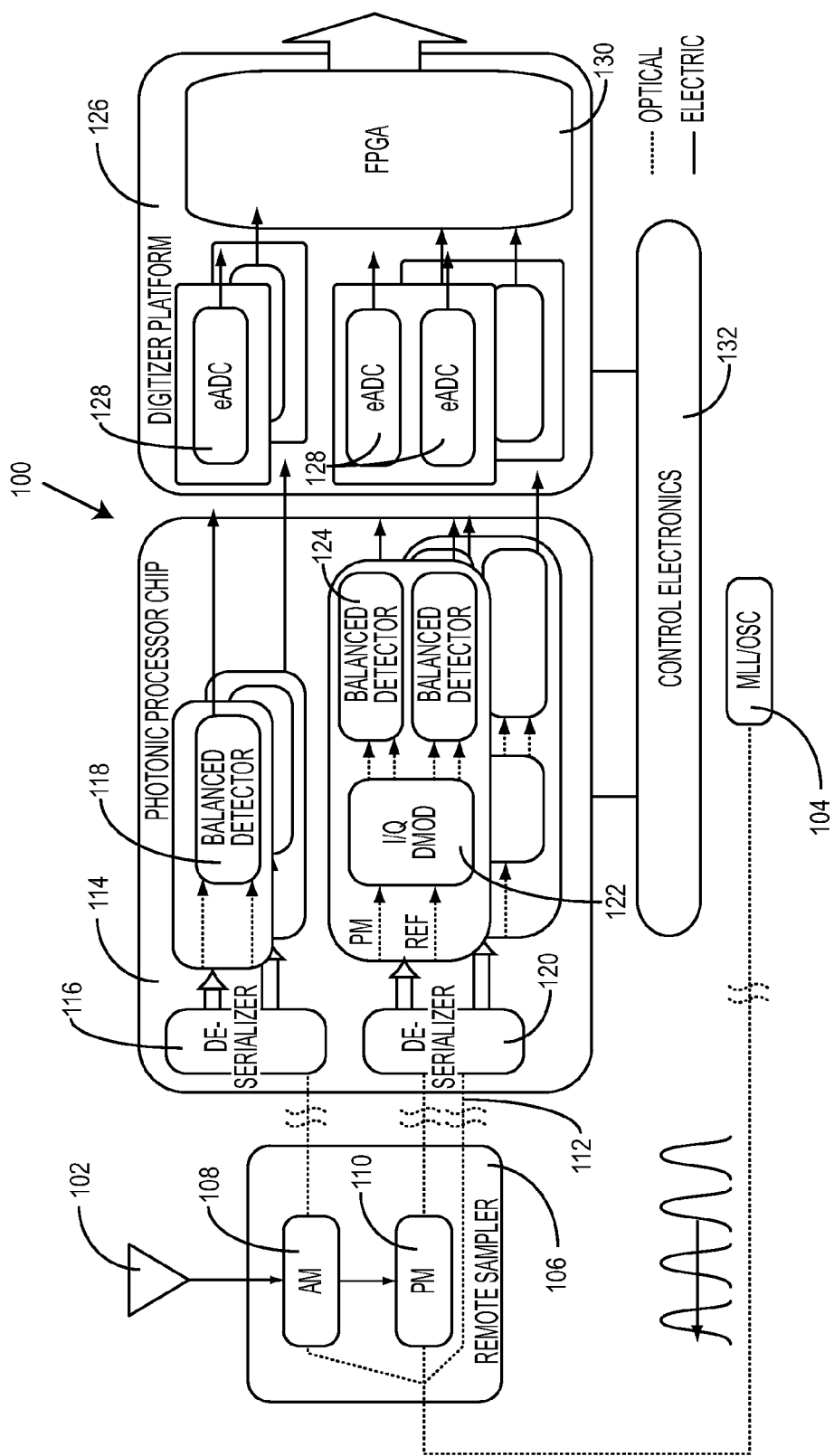
FIG. 1 is a block diagram of pADC system according to an exemplary embodiment.

Referring to FIG. 1, a photonic ADC (pADC) system 100, (e.g., a Phase Modulated pADC, an amplitude modulated pADC, or an otherwise modulated pADC) may overcome eADC performance boundaries in a readily scalable architecture, according to an exemplary embodiment. pADC system 100 may include Multi-Dimensional Quantization (MDQ) to enable 10 Effective Number of Bits (ENOB) with 10 GHz of instantaneous bandwidth (IBW). The MDQ technique modulates pulses of light in independent coordinates using a received RF signal. The independent coordinates can then be quantized with one or more eADCs, making it possible to combine several low ENOB eADCs to achieve increased system ENOB. This pADC approach does not rely on improvements to eADC technology to achieve higher levels of performance as conventional systems do.

As a result of MDQ, pADC system 100 may include a number of benefits including a 100× reduction in optical power requirements compared to intensity modulated direct detection (IMDD) approaches, using only 1 stage of deserialization because of high speed and low ENOB eADCs, low amplitude noise sensitivity due to I/Q demodulation, optical switch extinction ratio of 18 dB due to low ENOB eADCs, fewer eADCs to reduce SWAP compared to other pADC approaches, etc.

pADC system 100 samples an RF signal 102 with a stream (e.g., a 20 GHz stream) of optical pulses emitted by a mode locked laser and oscillator (MLL/OSC) 104. In parallel, the optical pulses are modulated in a sampler 106 (e.g., a remote sampler) using an amplitude modulator (AM) 108 and a phase modulator (PM) 110 by RF signal 102. The amplitude modulation is used to discriminate the number of 2π phase revolutions.

A reference signal 112 and the modulated signals are provided via an optical link to photonic processor chip 114. Processor chip 114 includes a deserializer 116 for receiving the AM signal and dividing it into two separate pulse streams (e.g., two 10 GHz pulse streams) and one or more balanced detectors 118 for detecting the difference between the pulse streams. Processor chip 114 also includes a deserializer 120 for receiving the PM signal and dividing it into two separate pulse streams (e.g., two 10 GHz pulse streams). The divided PM and reference signals are provided to one or more demodulators 122 for extracting dating data that is then sent to multiple balanced detectors 124 for detecting the difference between the pulse streams. The outputs from balanced detectors 118 and 124 are provided to a digitizer platform 126 including eADCs 128 for quantizing the optically demodulated I and Q signals and an FPGA 130 or other electronics for further processing or for transmittal to another electronics system. Processor chip 114 and digitizer platform 126 are controlled by control electronics 132, for example the demodulation of processor chip 114 and the electronic analog to digital conversion or FPGA operations may be controlled by electronics 132.

Figure 2:
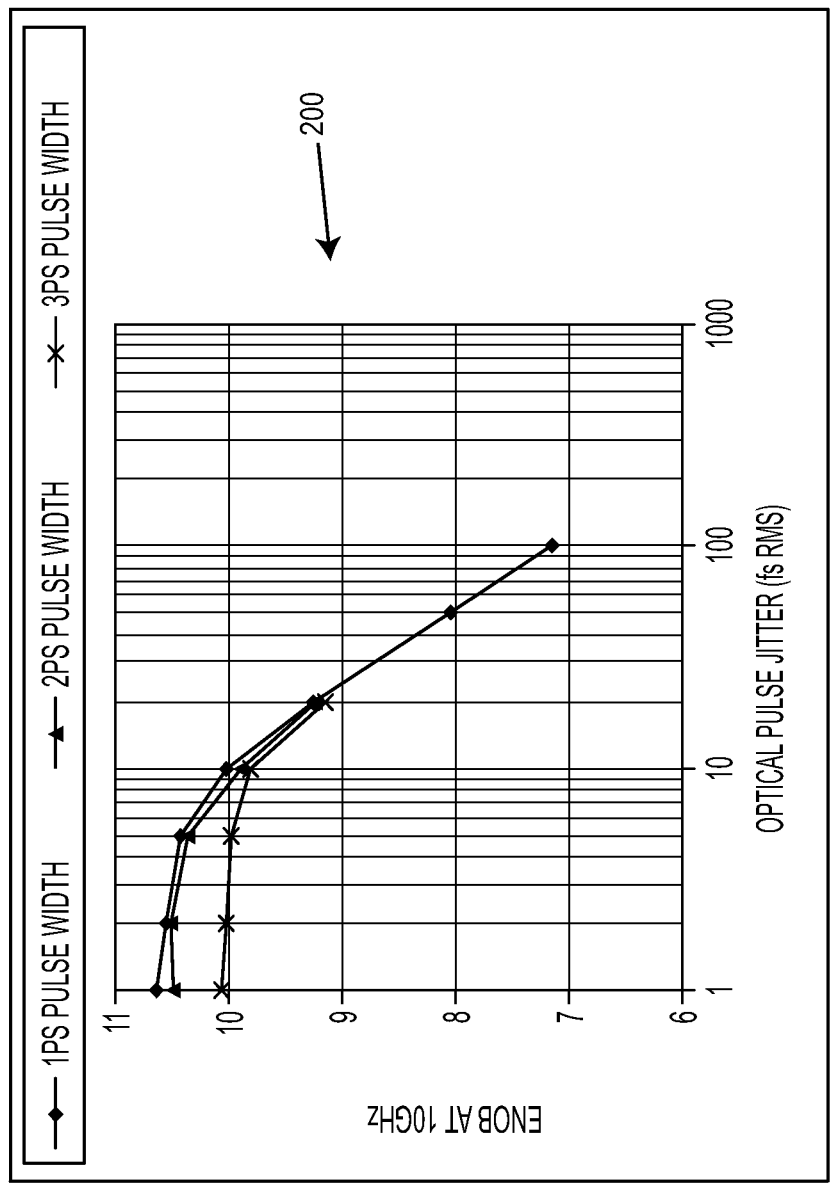
FIG. 2 is an illustration of increased quantization states for the system of FIG. 1, according to an exemplary embodiment.

Referring to FIG. 2, a graph 200 illustrates a full system 100 simulation, accounting for jitter and distortion sources according to an exemplary embodiment. According to some exemplary embodiments, mode locked laser 104 may have less than 10 fs of jitter and system 100 may achieve about 10 ENOB at 10 GHz for a 1 ps pulse width and near 10 ENOB at 10 GHz for a 2 or 3 ps pulse width.

Figure 3:
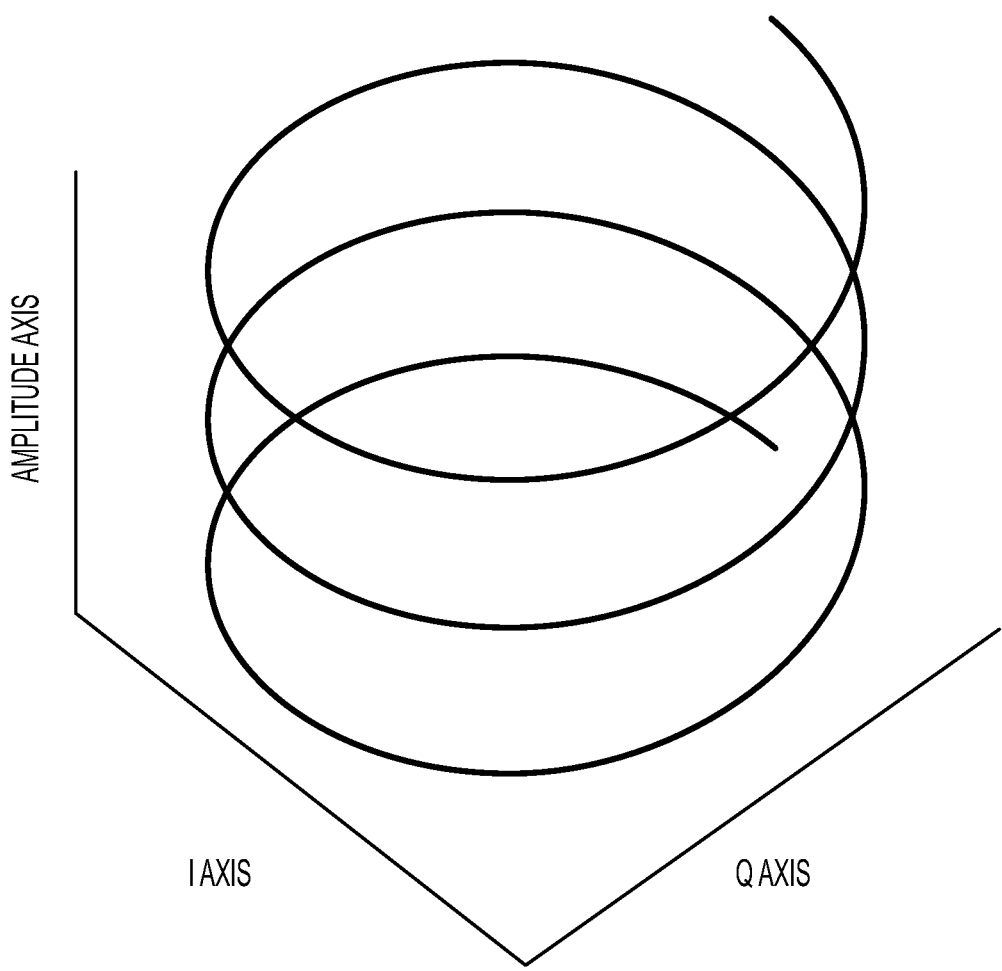
FIG. 3 is a graph illustrating potential performance of the pADC system of FIG. 1, according to an exemplary embodiment.

MDQ may increase ENOB through phase modulation at PM 110 and I/Q demodulation at demodulator 122. This technique modulates pulses of light in independent coordinates using received RF signal 102 and the independent coordinates are quantized with electronic ADC's (eADC) 128. This technique allows the use of eADCs for quantization that have lower ENOB, higher speed, and lower power than conventional pADC systems. System 100 includes both phase modulation and amplitude modulation for optimal performance. Amplitude modulation may be used to distinguish multiple phase rotations to further increase the overall system ENOB. The increase in quantization states with MDQ is illustrated in FIG. 3. According to other exemplary embodiments, amplitude modulation may be omitted from system 100 and only phase modulation may be used.

MDQ may enable various benefits of a pADC system including increased ENOB (e.g., about 1 ENOB per phase rotation above native eADC ENOB), about 100× reduced optical power requirements compared to amplitude modulated pADCs, optical switch extinction ratios that are reduced by about 12 dB allowing for a single stage of switches, power dissipation less than about 50 Watts through the use of lower ENOB eADC's, about a 10× increase in figure of merit over conventional ADC's, low noise sensitivity through I/Q demodulation and balanced detection, greater than about 2× reduction in total eADC power consumption, etc. According to various exemplary embodiments, the MLL and pADC system 100 components may be integrated in silicon to develop more practical ADC technologies.

Most conventional pADC research has focused on using eADC technology to quantize amplitude modulated optical signals. There are two primary limitations on the performance of eADCs: 1) clock jitter, and 2) comparator ambiguity limit for semiconductors. Conventional clock jitter of electronic clocks is about 100 fs, which limits the ENOB for a given input frequency. Furthermore, the ambiguity limit of the comparator may be limited by the semiconductor transition frequency, which is about 150 GHz. Conventional high performance eADCs may use time interleaving. One conventional electronic ADC operating at 20 GS/s may achieve 5.0 ENOB @ 6.6 GHz while another may achieve 6.5 ENOB @ 5 GHz.

Primary components for any analog to digital converter are the clock source and the sample and hold. Mode locked lasers are good sources of uniform optical pulse shapes that can be generated with low jitter and low amplitude noise. Quantum limited timing jitter may be observed in a harmonically mode locked soliton fiber laser with a measured timing jitter of about 9.74 fs close to theoretical estimates and attosecond timing jitter has been observed in actively mode locked fiber ring lasers. Quantum limited noise performance of an integrated mode locked laser with timing jitters may be as low as 47 fs. Monolithic passive mode locked lasers may also operate with low noise. Conventional low jitter mode locked lasers use RF oscillators, for example based on low phase noise RF oscillators. Conventional coupled opto-electronic oscillators (COEO) may be self-sustained regenerative lasers that generate both short optical pulses and ultra-low jitter microwave signal without the need for external microwave source. The COEOs are the only commercial available MLL that do not require external low noise microwave source for the generation of low jitter high repetition rate pulse train.

Conventional Van der Pol type oscillators have demonstrated low phase noise RF generation. These oscillators have been able to achieve jitter performance comparable to the performance of sapphire microwave whispering gallery mode resonators. A conventional chip-scale RF oscillator may integrate both optics and RF electronics. COEOs generate optical pulses that have not been used to combine low jitter oscillators with mode locked lasers.

One of the goals of silicon photonics is to use CMOS technology to bring a number of transmitter, receiver and other photonic technologies to a high volume, low cost capability. Conventional gigabit modulators in silicon may use a MOS based structure under depletion. The most rapidly advancing area of research to realize lasers on silicon is growing or transferring compound semiconductor structures to silicon wafers to either: 1) make compound semiconductor lasers and couple them to silicon waveguides, or 2) to make hybrid lasers on silicon that utilize silicon waveguides to form cavities while obtaining gain from the compound semiconductor layers. For example, electrically pumped InP microdisk lasers may be coupled to silicon waveguides, DFB lasers may be optically pumped, and electrically pumped lasers may include an optical supermode in the silicon region with a small portion evanescently coupled to the compound semiconductor region as well as at elevated temperatures.

At the core of a pADC is one or more analog optical links. Conventional analog optical links have been studied extensively with emphasis on intensity modulation (IMDD) because of its simplicity. Coherent optical links can achieve shot noise limited performance with an SFDR of about 125.6 $dB \cdot Hz^{2/3}$ for optical links using optical I/Q demodulation and about 124.3 $dB \cdot Hz^{2/3}$ using phase demodulation. These optical links may also use heterodyne demodulation. I/Q demodulation may be the most promising method for linear phase demodulation while providing two orthogonal coordinates for the MDQ approach.

Optical clocks may have about 10× less jitter than electronic clocks, enabling high ENOB ADCs. Electronic ADCs are limited by three primary issues: 1) electronic clock jitter is limited to about 100 fs, 2) 1 ps wide electronic aperture windows are difficult to achieve, and 3) capacitive coupling between the electronic drive signal and the input signal at the sample and hold is a significant limitation for window apertures on the order of 1 ps or less. In contrast, optical clocks (e.g., mode locked lasers) are capable of producing uniform optical pulse trains with quantum limited jitter and pulse widths on the order of 1 ps or less. By optically sampling an RF signal at an optical modulator, capacitive coupling can be eliminated.

The MDQ technique may enabling the use of low ENOB eADCs to overcome the limitations of other pADC approaches. MDQ enables a system (e.g., system 100) ENOB that is higher than any of its constituent parts while providing systemic ADC performance improvements. MDQ independently quantizing the following coordinates: I, Q, and amplitude with low ENOB eADCs. Further, MDQ measures the RF induced optical phase angle rotation in I and Q while simultaneously monitoring the RF induced optical amplitude to track multiple phase rotations. This approach allows the use of eADCs that are low ENOB, higher speed and lower power than other conventional pADC technologies. For example, a 10 GHz, 10 ENOB pADC may be achieved using only four eADCs with 6 ENOB, and two eADCs with 3 ENOB.

Figure 4B:
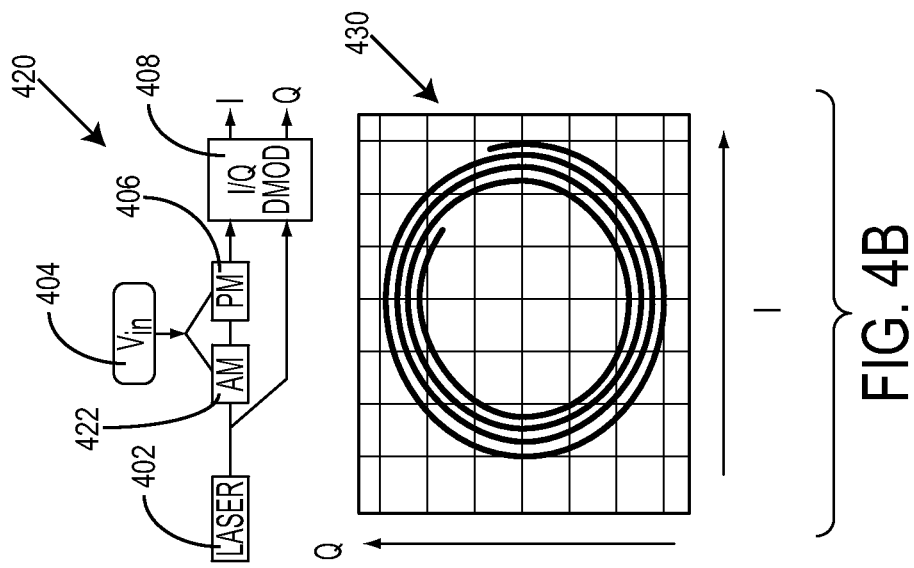
FIGS. 4A-4D illustrate pADC configurations and the respective outputs, according to four exemplary embodiments.
Figure 4A:
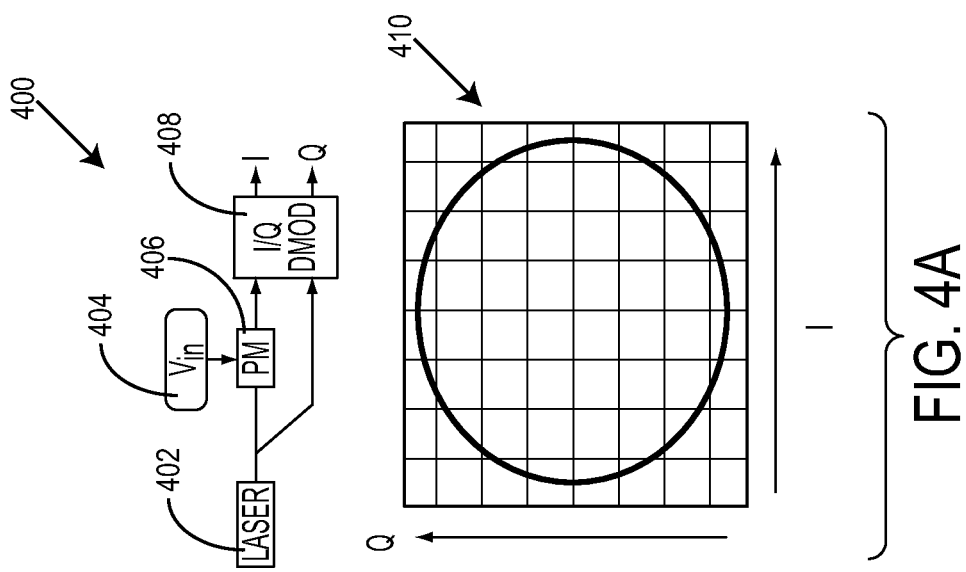

FIGS. 4A-4D illustrate four implementations and the resulting I,Q and A1,A2 spaces according to various exemplary embodiments. In FIG. 4A, according to one exemplary embodiment, a pADC 400 phase modulates an optical signal from a laser 402 by an RF signal 404 at a modulator 406. The optical signal is then phase demodulated with an optical I/Q demodulator 408 that outputs in-phase (I) and quadrature (Q) signals. An I-Q diagram 410 illustrates one full rotation for a voltage ranging from zero to $2V_g$. As an example of the MDQ concept, consider a situation where there is a one bit eADC on the I-axis and another one bit eADC on the Q-axis. In this case, a circle in I-Q space maps out 4 resolution states for one full rotation thereby yielding a pADC with 2 bits. With each additional rotation in I-Q space, the ENOB of the pADC is further increased. For multiple phase rotations, a third dimension, amplitude, can be quantized to track the number of revolutions. For two full phase rotations, a one bit eADC on the amplitude dimension would suffice. A three bit photonic ADC may use three one bit ADCs on each of the I, Q, and amplitude dimensions. Although the illustrated exemplary embodiment uses one bit eADCs, according to other exemplary embodiments, larger ENOB eADCs may be used on each of the three separate dimensions to achieve high ENOB pADCs. It is noted that according to various exemplary embodiments, any number of dimensions may be quantized, for example, one, two, three, four, or more dimensions.

FIG. 4B illustrates a pADC 420, according to another exemplary embodiment, in which the amplitude is modulated by a modulator 422 (e.g. a modulator with voltage dependent loss) simultaneously or in serial with the phase modulation. With this implementation, additional resolution states are mapped on diagram 430 with a spiral path in I/Q space thereby enabling a design path to increase ENOB.

Figure 4D:
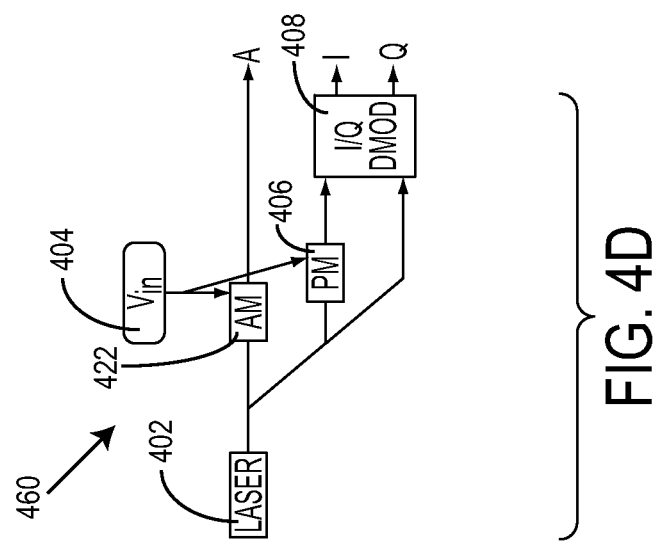
Figure 4C:
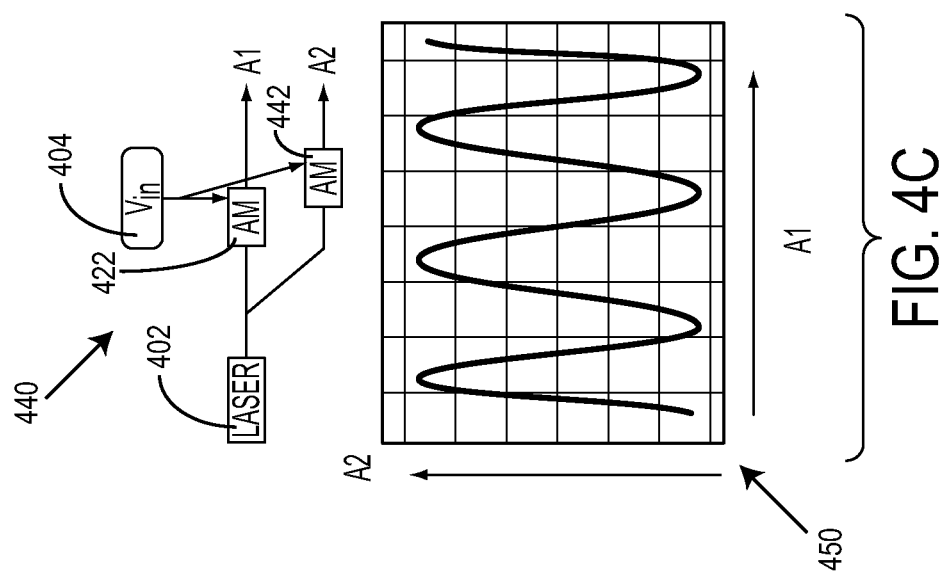

FIG. 4C illustrates a pADC 440, according to another exemplary embodiment, including amplitude modulator 422 as well as a second amplitude modulator 442. Amplitude modulators 422 and 442 output an amplitude having differing $V_g$ as shown in diagram 450, which increases the ENOB of the pADC over that of two constituent eADCs. For example, four different amplitude modulators may be used with 4 one bit eADCs.

FIG. 4D illustrates a pADC 460, which is a simplified version of system 100, according to another exemplary embodiment. The amplitude is modulated by modulator 422 in parallel with phase modulation by phase modulator 406. The phase modulated signal and reference signal from laser 402 are then phase demodulated with optical I/Q demodulator 408 that outputs in-phase (I) and quadrature (Q) signals. Amplitude modulator 422 outputs a modulated amplitude signal. With this implementation, additional resolution states are mapped in three dimensions on the diagram of FIG. 3 with a spiral path in I/Q space along an amplitude axis, thereby enabling a design path to increase ENOB.

Many conventional pADC approaches implement IMDD optical links. pADCs based on IMDD links have two fundamental limitations: 1) the eADC must be at least as good as the ENOB of the resultant pADC, and 2) the IMDD link must have a signal to noise ratio capable of achieving the required ENOB. Table 1 shows an approximate comparison of pADC system 100 versus an intensity modulated direct detection link with deserialization assuming a pADC with 10 Ghz input frequency at 10 ENOB, according to an exemplary embodiment.

TABLE 1

Comparison of pADC system 100 Versus an IMDD Link with Deserialization

| Parameter | pADC IQ | pADC Amplitude | IMDD | Units | Comments |
|---|---|---|---|---|---|
| Required eADC ENOB | 6 | 3 | 10 | Bits | |
| Optical Switch Extinction Ratio | 18 | 9 | 30 | dB | |
| Minimum Detectable Peak Optical Power | 7.9 | −11 | 32 | dBm | 1 ps wide pulse |
| Minimum Average Optical Power | −9 | −28 | 15 | dBm | @ 20 GHz |
| Max. Allowable Amplitude Noise | <5 | <5 | <0.03 | % | |
| Figure of Merit for pADC | ≈0.13FOM$_{eADC}$ | | FOM$_{eADC}$ | — | |
| Max Input Frequency of eADC | 5 | 5 | 2 | GHz | |
| #eADCs required for 10 GHz input (Note) | 4 | 2 | 40 | — | |
| Estimated eADC Power Dissipation | 46.2 | | 110 | Watts | eADCs Only |

Note:
assumes phase encoded sampling

One consequence of the MDQ approach is that the Figure of Merit (FoM) of the pADC is smaller than the FoM of the constituent eADCs. Further elaborations on the results highlighted in this table can be found below. Systemic pADC improvement may be realized by implementing MDQ with lower ENOB eADCs, for example, electrical power dissipation may be decreased (e.g., by less than about 50 Watts), the optical switch extinction ratio may be decreased (e.g., by about 12 dB), eADC input frequency can be increased to about 5 GHz, amplitude noise tolerance may be increased by more than 10×, FoM of the pADC can be reduced by about 10× compared to FoM eADCs, the required optical power may be reduced, etc.

Referring again to FIG. 1, a full system architecture is shown with subcomponents for pADC system 100. System 100 uses three quantization coordinates: 1) two orthogonal phase coordinates I and Q, and 2) one amplitude coordinate to track the phase revolutions greater than $2\pi$. The system parameters are obtained from system 100 simulations to achieve performance of 10 ENOB at a 10 GHz input frequency. The parameters calculated include optical pulse width, jitter, optical phase shift at remote sampler 106, and the ENOB of eADCs 128.

Referring again to FIG. 2, simulation 200 depicts ENOB versus optical pulse jitter. Simulation 200 accounts for the jitter of the optical pulse stream, the optical pulse width, the jitter in the eADC 128 aperture window, and the total phase shift of the optical phase modulator 110. The resolution bits for pADC system 100 are calculated from the error in a reconstructed waveform. Simulation 200 indicates that with an optical pulse source of less than about 10 fs jitter and an optical pulse width less than about 2 ps, pADC system 100 may achieve 10 ENOB. Simulation 200 defines MLL 104 jitter requirements for less than about 50 fs, less than about 25 fs, and less than about 10 fs. Based on the results, mode locked laser source 104 may have a pulse width of less than about 2 ps, in order to sample RF signals up to 10 GHz with 10 ENOB.

Figure 5:
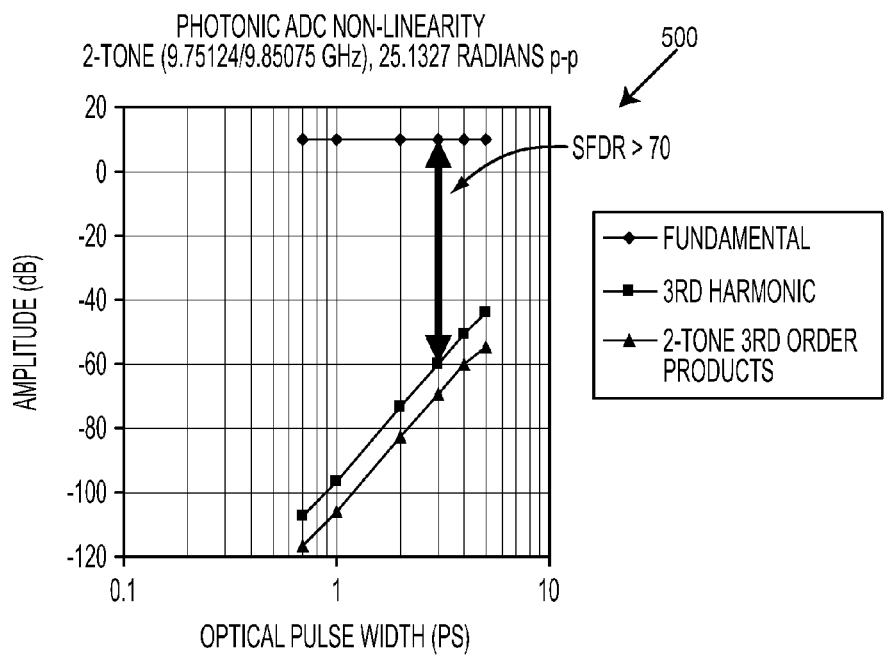
FIG. 5 is a graph illustrating SFDR performance of a pADC according to an exemplary embodiment.

Referring to FIG. 5, in addition to meeting ENOB and Input Frequency metrics, SFDR may be considered, according to an exemplary embodiment. A simulation 500 of pADC system 100 illustrates the impact of two tone 3rd order products. The source of the nonlinearity is due to the distortion resulting from sampling an RF signal with an optical pulse of finite width. In order to improve SFDR, the optical pulse width should be less than about 2 ps.

Figure 6:
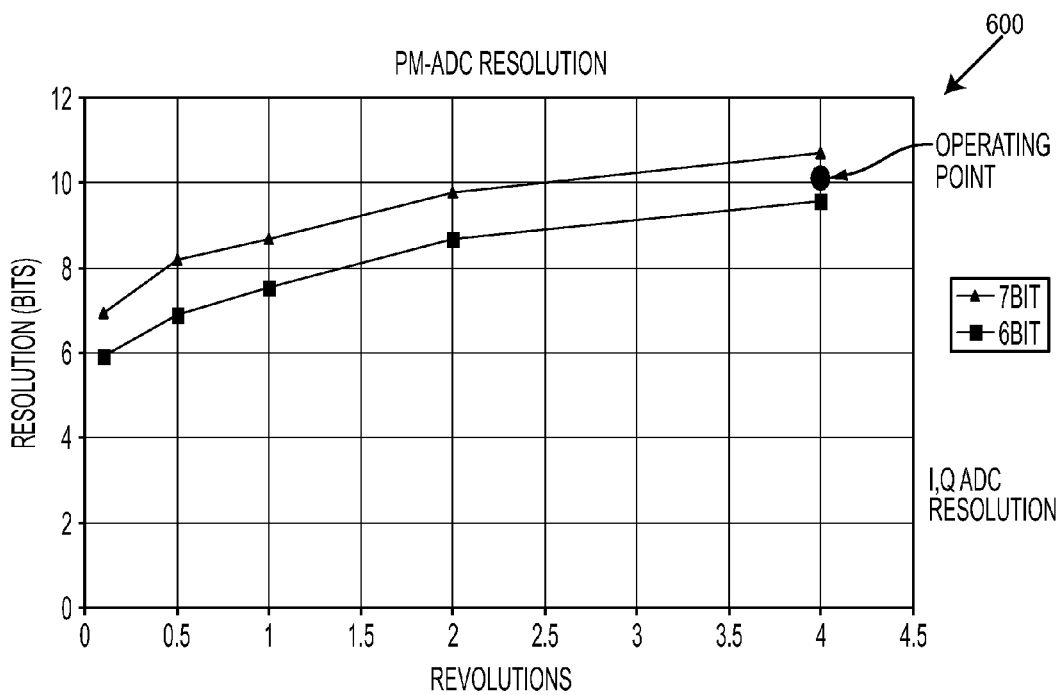
FIG. 6 is a graph illustrating ENOB performance of a pADC according to an exemplary embodiment.

Referring to FIG. 6, a simulation 600 shows that pADC system 100 can achieve 10 ENOB with a 6.5 ENOB eADC, with an RF induced phase shift of up to 4 full $2\pi$ phase rotations, according to an exemplary embodiment. Simulation 600 takes into account the approximately 10 fs of optical jitter, about a 200 fs eADC aperture jitter, and about 1 ps optical pulse width. For 6 ENOB eADCs, 4.5 full rotations may be used. In order to resolve the 4.5 phase rotations, system 100 may implement separate amplitude modulator 108 to track the multiple RF induced phase rotations, hence the 3 ENOB eADC on the amplitude dimension. In summary, 6 ENOB eADCs are used to quantize the I and Q coordinates, and a 3 ENOB eADC is used to quantize the amplitude coordinate.

Figure 7:
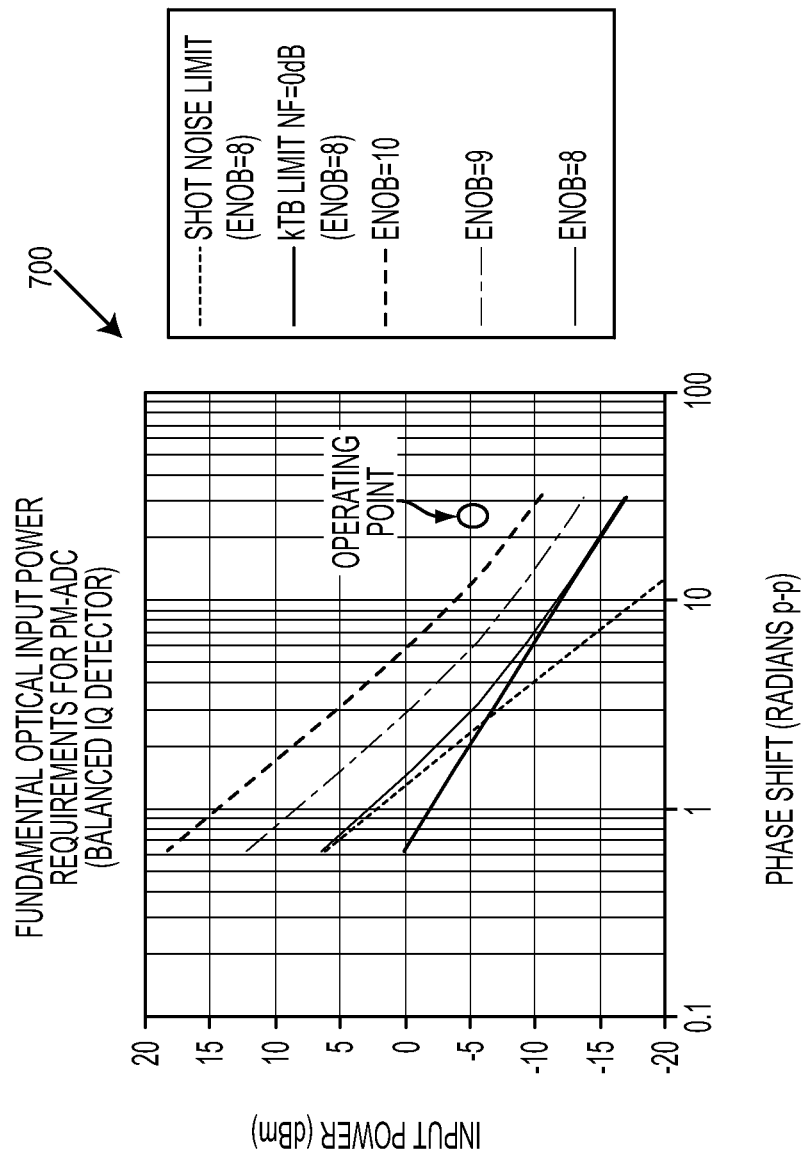
FIG. 7 is a graph illustrating potential input power of a pADC to achieve 10 ENOB, according to an exemplary embodiment.

FIG. 7 illustrates a graph 700 of the theoretical limit for the average optical power into I/Q demodulator 122 of pADC system 100 to achieve 10 ENOB (i.e. component losses are zero), according to an exemplary embodiment. The minimum required optical power into the remote optical sampler may be substantially smaller than pADC approaches based on IMDD optical links. The minimum required optical power can be determined by thermal noise in the detectors and electronics at the input to eADCs 128. The required optical power decreases with increasing voltage induced phase shift at remote sampler 106 because the phase angle in I/Q space increases, thereby allowing a reduction in the average optical input power. The reduced optical power with increasing phase shift may be a significant advantage over conventional IMDD pADC approaches.

According to some exemplary embodiments, high frequency, low ENOB eADCs 128 may be eADCs available from Maxtek of Beaverton, Oreg. The Maxtek eADCs are conventionally used in the DSA72004, available from Tektronix of Beaverton, Oreg., which is a 50 GSa/sec oscilloscope. This oscilloscope contains the electronics, algorithms, and self-calibration capable of processing the streaming data from pADC system 100. Maxtek eADCs can achieve greater than 6 ENOB at 5 GHz input frequency (allowing a 10 GHz input frequency when used with deserialization).

According to some exemplary embodiments, the performance, calibration and correction algorithms, on-going non-linear correction algorithms to improve SFDR, and a chipset having a real time streaming architecture can be used as digitizer platform 126. SFDR performance may be improved using post processing algorithms to linearize the eADC system. On digitizer platform 126, a low-noise transimpedance amplifier with filtering may be used to match the output of the photodetectors to the input of eADC 128.

The digital processor board may contain calibration algorithms and system level calibration may be performed at power-on. The eADC architecture is self-calibrating as the calibration signals are generated by the system. There may be no need to remove the RF input signals and replace them with calibration signals. After power-on calibration, typical operation in a room temperature environment may not require recalibration unless the ambient temperature drifts significantly. It is possible to trigger a calibration, through software at any time, or in response to a pre-determined temperature shift. The eADC calibration approach is independent of the input signal and is thus frequency independent and is acceptable for continuous signals. Post processing linearization of the eADC system to improve SFDR performance may be a one time static calibration that will be implemented as a post processing to the data prior to ENOB and SFDR calculations.

Another component in chip-scale photonic ADC 100 is photonic processor chip 114. Chip 114 includes deserializers 116 and 120 incorporating narrowband optical switches, I/Q demodulators 122, and balanced photodetectors 118 and 124. Processor chip 114 is configured to perform balanced photodetection, I/Q optical demodulation, and deserialization (e.g., from 20 GHz to 10 GHz). According to one exemplary embodiment, processor chip 114 may include a $V_g$ of up to about 1 V at an operating frequency of about 10 GHz (e.g., narrow band operation to reduce $V_g$) for an average input optical power of greater than about 2 dBm, a peak optical power of about 15 dBm, and an optical wavelength of between about 1530 nm and 1560 nm. It is noted that according to other exemplary embodiments, these operating parameters may be different.

Figure 8:
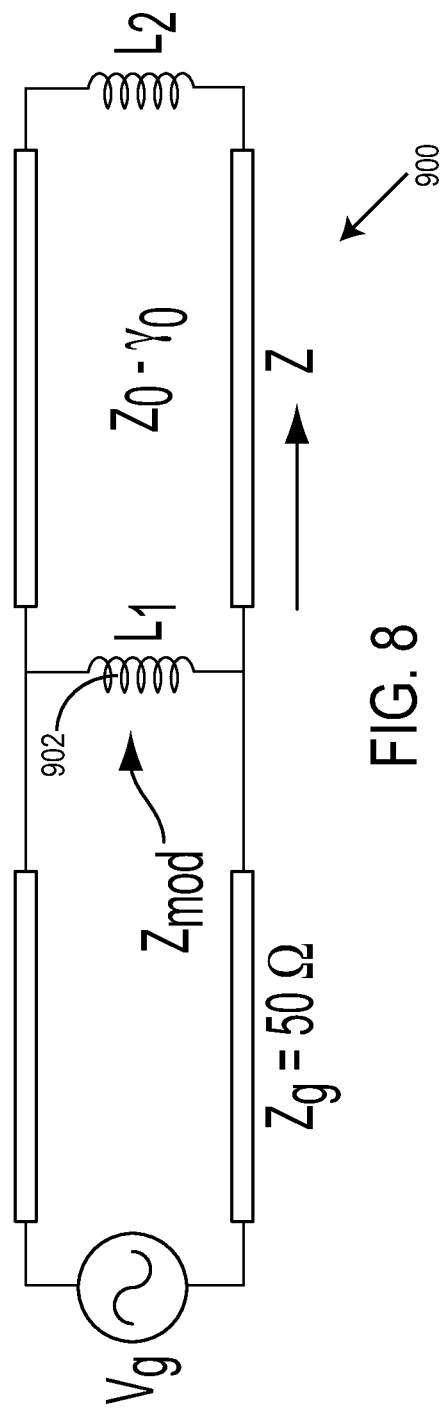
FIG. 8 is a schematic diagram of a resonant modulator that may be used in the system of FIG. 1, according to an exemplary embodiment.

FIG. 8 is a schematic representation of a generalized resonant modulator 900 (e.g., that may be used as modulator 108 or 110) including an inductive reflective element 902 used to form a cavity, according to an exemplary embodiment. A physical model of modulator 900 may include reflective terminations to an MZ modulator to create a microwave cavity to enhance the field and suppress reflections at the resonance frequency. Modulator 900 may include a modulation field enhancement at its center that is predicted for an 0.75 mm modulator electrode structure with varying levels of loss.

Figure 9:
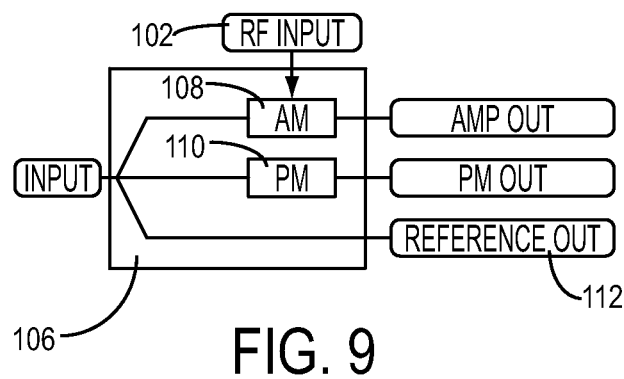
FIG. 9 is a block diagram of an optical sampler or modulator that may be used in the system of FIG. 1, according to an exemplary embodiment.

Referring also to FIG. 9, remote operation of system 100 can be performed by locating remote sampler 106 at a distance from photonic processor 114, according to an exemplary embodiment. One challenge in remote operation is the temporal alignment of the phase modulated and reference signals on separate fibers. This challenge can be met with the use of delay lines. In a field unit, the reference and phase modulated signals may be serialized into a single optical fiber returning from remote sampler 106. At photonic processor chip 114, deserializer 120 would separate the reference and phase modulated signals. In that case, an environmentally robust design may enable remote operation under any or almost any condition as well as providing matched path lengths over the same fiber for both the signal and reference pulses.

According to one exemplary embodiment, COTS electronics components may be used for providing drive signals for the optical switches. According to other exemplary embodiments, control electronics 132 may be used to control photonic processing chip 114 as well as provide timing signals for digitizing board 126. The power dissipation of control electronics 132 may be much lower than the power for eADCs 128. Because the drive voltage for photonic processor 114 optical switches are less than about 1 Volt, the drive power required to switch the modulator may be about 2.5 mW/switch. Assuming an RF amplifier power efficiency of about 30% the max power dissipation may yield about 8.3 mW/circuit. Three such circuits may be used for a total power dissipation of about 25 mW.

The $V_g$ for phase modulator 110 may be low to enable multiple phase rotations, according to an exemplary embodiment. For example, custom lithium niobate modulators are capable of operating with $V_g$ as low as about 1.5 Volts at 10 GHz input frequency.

The branching ratios for sampler 106 are determined by the resolution of eADCs 128 for the amplitude and phase channels. The minimum required detected power for a 6 ENOB ADC may be about 13 mW. The minimum required detected power for a 3 ENOB ADC on the amplitude channel may be about 78 μW. Therefore, the branching ratios for the microwave optical sampler are approximately 49.5% into the reference and phase modulated channels and 1% into the amplitude channel.

Figure 10A:
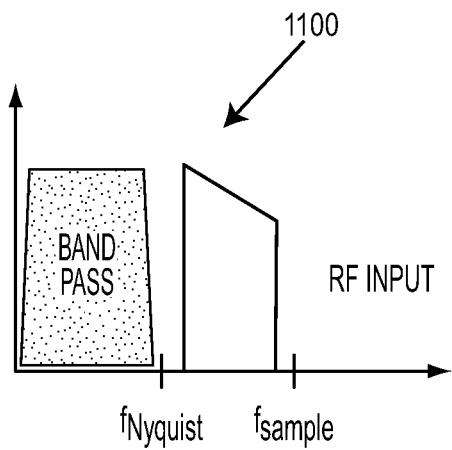
FIGS. 10A and 10B are graphs illustrating optical undersampling, according to an exemplary embodiment.
Figure 10B:
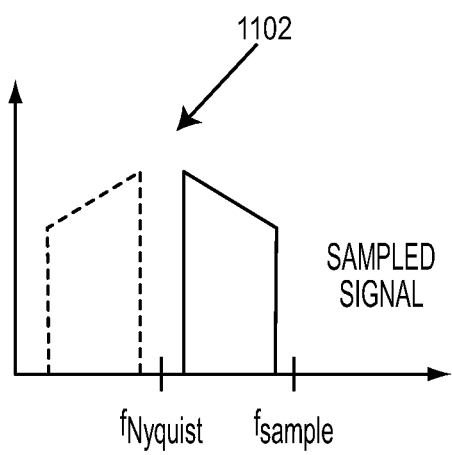

FIGS. 10A and 10B illustrate the principle of operation for optical under-sampling, according to an exemplary embodiment. Referring specifically to a graph 1100 of FIG. 10A, an optical pulse stream samples a high frequency microwave signal between about 12-18 GHz using a bandpass filter. Referring also to a graph 1102 of FIG. 10B, the microwave signal is aliased down to baseband. By blocking the baseband signal before the optical modulator, the high frequency microwave signal can be downconverted to baseband in the optical domain. The frequency-inverted signal can be processed digitally to obtain the original signal of interest.

Figure 11:
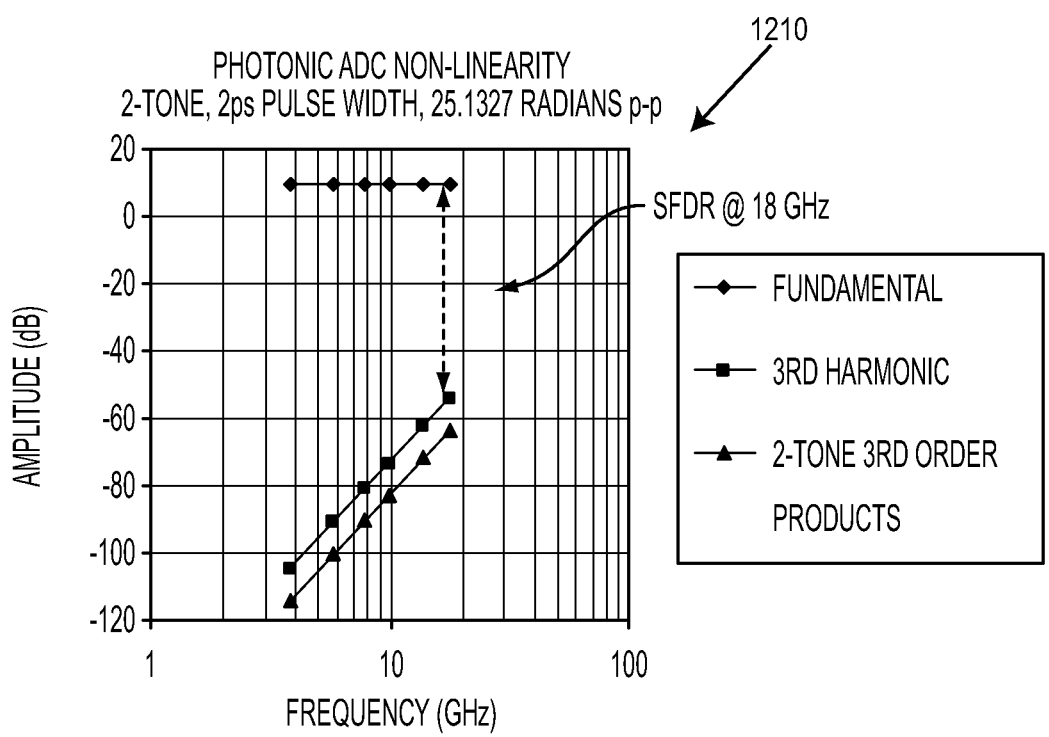
FIG. 11 is a graph illustrating SFDR performance of a pADC, according to an exemplary embodiment.

FIG. 11 shows a simulation 1210 of the SFDR in the 12-18 GHz band, according to an exemplary embodiment. Simulation 1210 shows that both the jitter and the pulse width requirements may be more stringent for 12-18 GHz operation.

A further consideration for remote operation is the pulse propagation from mode locked laser 104 to remote sampler 106. Pulse propagation may be handled in multiple ways, for example, by dispersion compensation or by soliton propagation.

By implementing the approach outlined above, various benefits of pADC system 100 may be realized when compared to conventional pADC approaches, for example, about 100× reduction in optical power requirements, about 10× reduction in noise sensitivity, deserializer extinction ratio reduced (e.g., by about 12 dB), low power dissipation (e.g., less than about 50 Watts), high speed signal processing, about a 10× reduction in ADC figure of merit, etc.

The approach of pADC system 100 may provides a 100× reduction in optical power requirements when compared to conventional pADCs based on IMDD analog optical links. As an example, assume that 6 ENOB eADCs 128 are used for each of the two phase coordinates. The shot noise requirement for the minimum number of photons in a pulse for a given eADC $ENOB_{eADC}$ may be given as: $12(2^{ENOB_{eADC}}-1)_2$. For example, for a 1 ps wide pulse at the I and Q photodetectors, the minimum required peak optical power may be about 6 mW per pulse. In contrast, a pADC based on an IMDD analog optical link may require an optical power at the detector of about 1.6 W/pulse. The required peak power per pulse for a pADC system 100 is about 21 dB less than the peak power required by an equivalent pADC based on an IMDD analog link.

Referring to FIG. 12, system 100 uses balanced detection to improve noise immunity by 10×. This improvement in noise immunity may minimize the number and power of eADCs 128, thereby dramatically reducing calibration requirements and providing a much more robust platform to achieve 10 ENOB. FIGS. 12A-12C illustrate the results of simulations for three different pADC topologies (e.g., the same topologies considered in FIG. 4) with balanced detection, while FIGS. 12D-12F illustrate the results of simulations for the three topologies with unbalanced detection according to various exemplary embodiments. The background grid corresponds to 6 ENOB resolution states along the x and y axes, leading to a pADC resolution of about 8 ENOB (corresponding to the number of line segments in each diagram). The discrete line segments correspond to sampling an RF signal with optical pulses that have amplitude noise. The length of the line segment corresponds to amplitude noise, and the width of the line segment corresponds to phase noise.

Figure 12C:
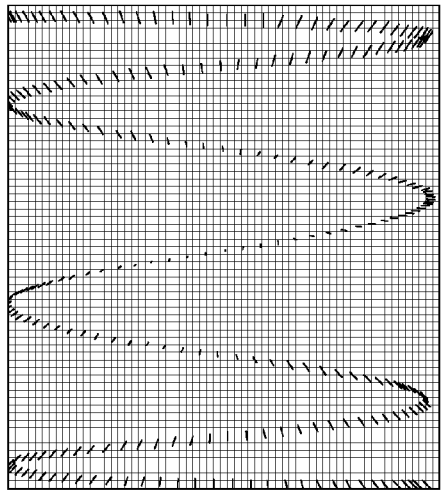
FIGS. 12A-12C illustrate outputs of a pADC with balanced detection, according to three exemplary embodiments.
Figure 12F:
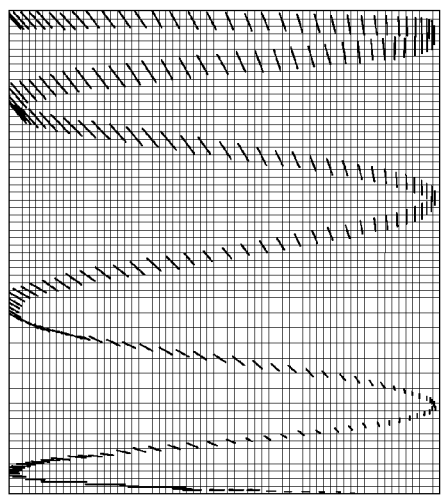
FIGS. 12D-12F illustrate outputs of a pADC with unbalanced detection, according to three exemplary embodiments.
Figure 12B:
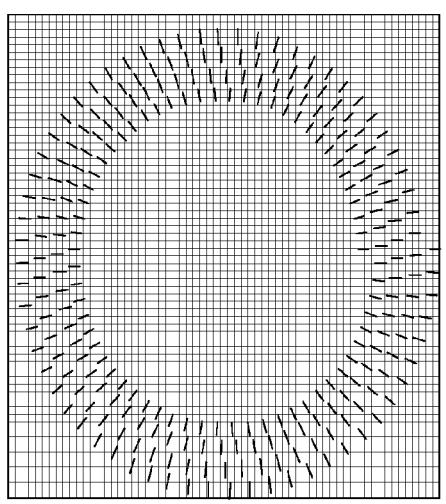
Figure 12E:
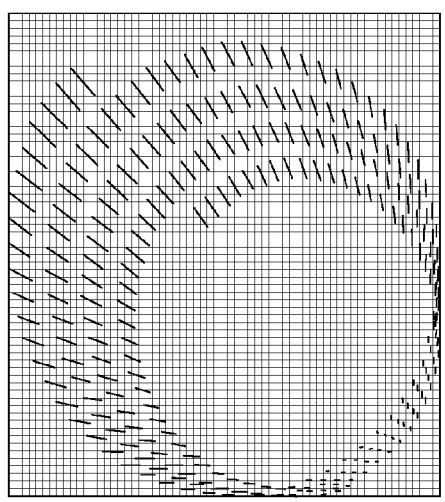
Figure 12A:
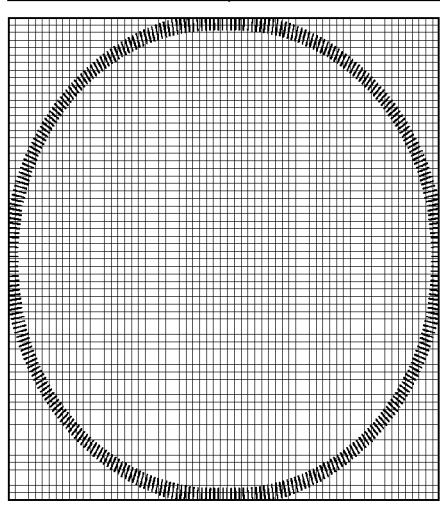
Figure 12D:
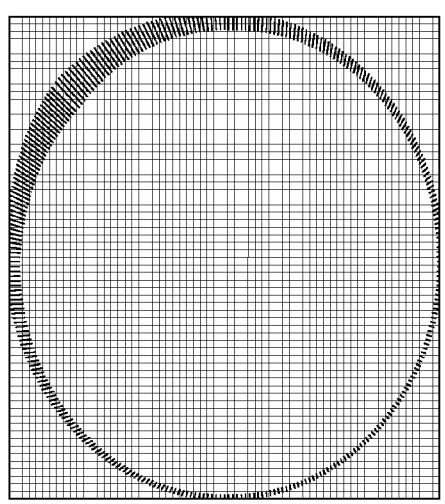

FIGS. 12D-F correspond to unbalanced detection and illustrate that there are conditions where line segments can be blurred. FIGS. 12A-12C correspond to balanced detection and show that the line segments can be distinguishable. Balanced detection combined with I,Q demodulation may enable high resolution of the phase modulated signal on a stream of optical pulses with amplitude noise.

For high speed pADCs it may be desirable to deserialize the optical sampling pulse stream to parallel streams at a rate that eADCs 128 can handle. To do this, the optical deserializer 120 may have an extinction ratio that is $10 \log_{10}$ (ENOB$_{eADC}$). Approaches without MDQ, may require 10 ENOB eADCs with extinction ratios of the MZ optical switches of 30 dB. In contrast, in the approach described above for pADC system 100, the extinction ratio can be reduced to about 18 dB because only 6 ENOB eADCs may be needed. This is a significant advantage because 18 dB of extinction only requires a single MZ, but 30 dB may require every switch to be replaced by two or more, thereby doubling the insertion loss.

A further advantage of MDQ is that low ENOB eADCs dissipate less power than high ENOB eADCs. By taking advantage of high frequency, low ENOB eADCs, the overall power requirement of pADC system 100 is reduced by using fewer eADCs and less deserialization.

Figure 13:
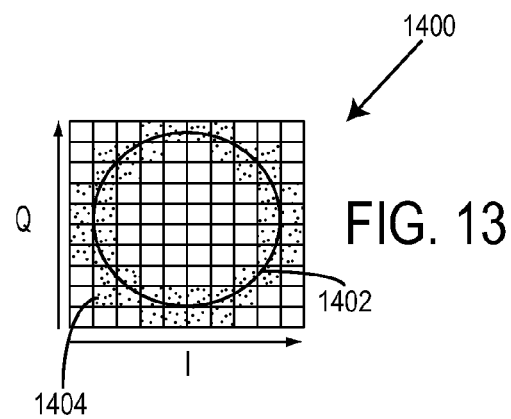
FIG. 13 illustrates a look-up table that may be used in the system of FIG. 1, according to an exemplary embodiment.

Referring to FIG. 13, a lookup table 1400 can be used in FPGA 130 for high speed signal processing of the I/Q signal, according to an exemplary embodiment. Look-up table 1400 is a simplified illustration and other exemplary embodiments may use more complex look-up tables. Circle 1402 traces out the possible phase states, and stippled blocks 1404 represent the look up table values stored in FPGA 130 that relate I and Q coordinates to specific phase values. Using a sparse look up table, pADC system 100 may dramatically reduce computational requirements. Conventional approaches require arctangent calculations, which are very processor intensive, draw significant power, and limit scalability to higher frequencies.

Another parameter for comparing ADC performance is conversion efficiency where the figure of merit can be reduced by 10×. Typically, this efficiency is expressed using the following Figure of Merit (FoM): FoM=$P_{DC}$(Watts)/$f_{samp}$(Hz)·$2^{ENOB_{pADC}}$. The figure of merit for pADC system 100 may be about 2.3 W/Hz-LSB, according to one exemplary embodiment.

The FoM demonstrates a compelling argument in favor of the approach of pADC system 100. Consider a pADC based on IMDD analog optical links that includes an amplitude optical modulator connected by optical fiber to a single photodetector with a single eADC. Compare that system to a similar system using the three coordinate approach with I, Q, and Amplitude including three eADCs. Also assume that the eADC technologies all have the same FoM. Then it can be shown that for the pADC system 100:

$$FoM_{pADC}=FoM_{eADC}2^{ENOB_{Amp}-ENOB_{pADC}}+2FoM_{eADC}2^{ENOB_{I,Q}-ENOB_{pADC}}$$

And for the IMDD pADC:

$$FoM_{pADC}=FoM_{eACD}$$

With the pADC system 100 approach, the FoM of the pADC may be reduced by a factor of 8 compared to the FoM of the eADC (because ENOB$_{Am,I,Q}$ are <ENOB$_{pADC}$). However, in the IMDD pADC approaches, the FoM of the pADC can be no better than the FoM of the constituent eADCs.

The approach of pADC system 100 enables the use of low ENOB eADCs 128. Consequently, it is possible to select commercially available high frequency eADCs for use in high ENOB pADC system 100. According to one exemplary embodiment, Maxtek's 6 ENOB @ 12.5 Gsa/sec eADC may be used. The complication with pADC approaches that implement IMDD analog optical links is that high ENOB pADCs require high ENOB eADCs. As an example, National Semiconductor makes an eADC (ADC10D1000) operating at 2 Gsa/sec with 10 physical bits and 9 ENOB. Oversampling is required to achieve a 10 ENOB pADC. To achieve 20 Gsa/sec, it is necessary to use 10 National Semiconductor ADCs with multiple levels of optical deserialization. In contrast, the approach of system 100 requires only one level of deserialization.

The use of the pADC technology described above may enable greater increased capability by providing new building blocks for RF system architectures. The system may provide broadband-direct conversion of RF/Microwave signals and remote optical connection of the antenna to the receiver hardware. The ability to capture 10 GHz of instantaneous bandwidth may enable new system capabilities. The application space for new technological capabilities provided by pADC system 100 may include high ENOB and low input frequency, medium ENOB and medium input frequency, and low ENOB and high frequency. Each of these corresponds to new capabilities in RF and microwave systems. Although, the described technology is primarily discussed with reference to medium ENOB and medium frequency, according to other exemplary embodiments, pADC system 100 may be used for varying ENOB and frequencies and may impact the development of new pADC technology in such applicable applications. Some exemplary applications for the pADC technology are outlined in Table 9, although further applications are numerous.

TABLE 8

Exemplary pADC application space by signal bandwidth and ENOB performance

| Low Frequency, High ENOB | Medium Frequency, Medium ENOB | High Frequency, Low ENOB |
|---|---|---|
| Direct Feedback Control | Spectral Sensing (SIGINT & ELINT) UWB Comm for LPI/LPD X Band Radar Broadband Interference Excision Defeats Snuggling SDR | Direct Conversion Ku Band Fiber Optic Networking Free Space Optical Comm |

The successful realization of pADC technologies will have widespread utility across military and commercial platforms, especially in the areas of communications, electronic warfare, radar, and test/measurement equipment As new RF/Microwave signal threats emerge, future electronic warfare (EW) systems must stay ahead of the curve. Some of these threats come from new technologically-advanced systems with wider bandwidths, lower power and advanced modulations resulting in emitters that are much more difficult to detect and process. The need to exploit these and future threats will require digital receivers with very-wide-bandwidth ADCs that can easily be adapted to the back-end processors. Next-generation EW systems must be architected to address these challenges using very wideband digital receivers, flexible high-speed data distribution and adaptable signal processing.

Conventional EW systems are constrained by conventional ADC technology limitations in sample rate, dynamic range and aperture jitter. The aperture jitter performance for conventional ADCs limits the ENOB. To get around this, conventional EW receivers rely on analog down-conversion of the RF signal to an intermediate frequency of 1 GHz or less with an associated instantaneous bandwidth of 500 MHz or less. The conventional approach requires analog down-converter hardware that is expensive and lacks flexibility. Additionally, this approach limits the available digitized bandwidth to 500 MHz or less, resulting in reduced-capability of RF detection. Digitizing a larger portion of the RF spectrum is required to handle modern frequency-agile emitters and to create new EW systems that are flexible and adaptable to modern threats. Photonic ADC 100 can meet these needs.

Figure 14:
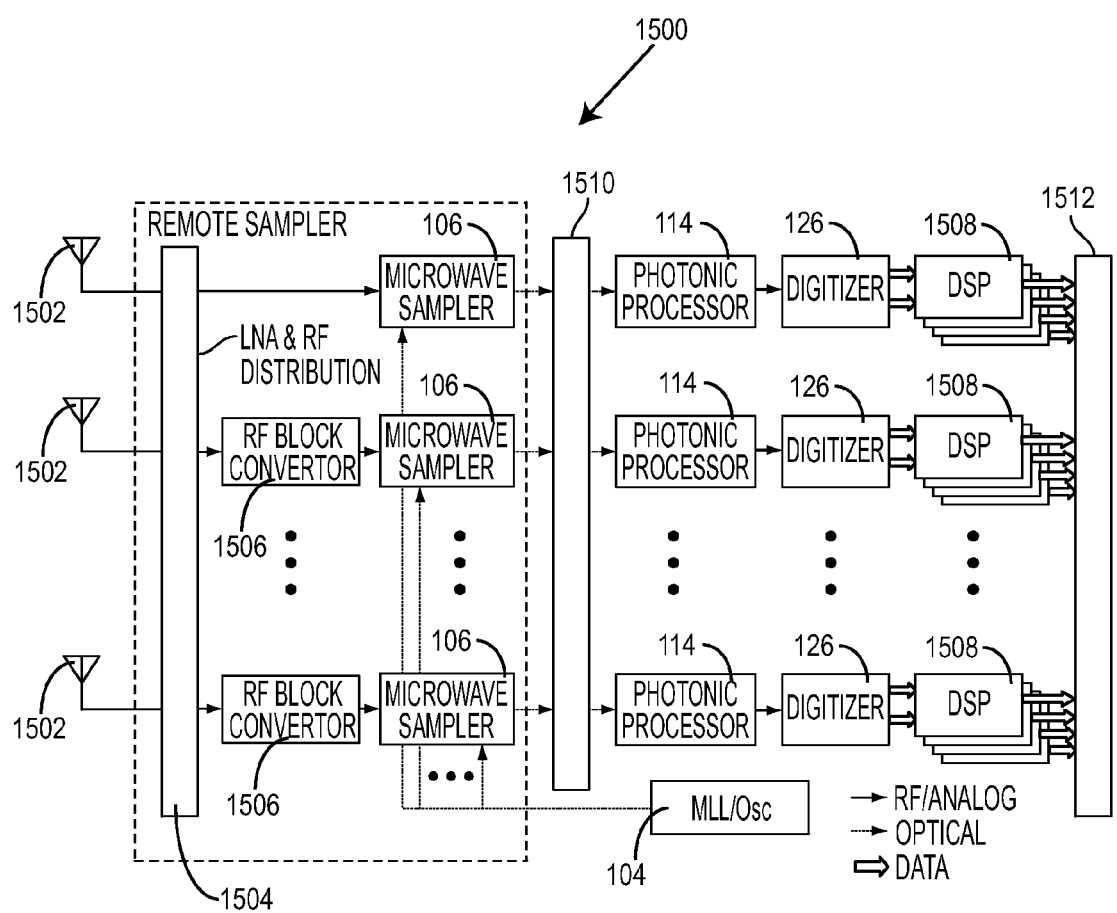
FIG. 14 is a pADC broadband receiver, according to an exemplary embodiment.

Referring to FIG. 14, a pADC EW architecture 1500 may be based on wideband digital receiver technology. A digital receiver based system provides the flexibility to combat current and future threats. Antenna apertures 1502 are connected through a combination LNA and RF distribution network 1504 to a pADC or microwave sampler 106 or RF block converters 1506.

RF Block Converters 1506 output a spectrum that is 10 GHz wide for digital conversion by pADC sampler 106. The output of sampler 106 may be about a 20 Gs/s data stream that is sent to digital signal processors 1508. An optional optical switch 1510 provides the capability to process the data using multiple DSPs 1508 for transmission on a data network 1512. Architecture 1500 is extensible to cover a frequency range of about 20 MHz to greater than about 100 GHz according to various exemplary embodiments. The advantage of this system is the resultant 20× improvement in instantaneous bandwidth that enables detection and identification of extremely low dwell time signals.

Future communication systems may include software defined radios (SDR). A fully-reconfigurable radio can adapt to a new standard or accommodate multiple standards through software updates. Today, the biggest challenge to system designers is the electronic ADC. The pADC technology will provide the breakthrough technology to bring true SDR closer to reality.

SDR may allow operators to deploy one network and one set of infrastructure capable of handling a broad range of radio frequencies and standards, plus will readily accommodate future evolutions. To do so, communications system must be flexible enough to allow wider frequency coverage and bandwidth than narrowband, fixed frequency systems. Due to the wide diversity of signals, an SDR needs to offer dynamic range beyond the capabilities of the narrow band applications. Ultimately, the SDR will have to function in multi-carrier environments with carriers of different modulation types, bandwidth, power and other attributes. The critical component in achieving these goals is generally the ADC.

According to various exemplary embodiments, any antenna can be accessed by any software defined radio to perform any radio function. pADC system 100 may enable the ability to locate software-defined receivers remotely from an antenna in a way that allows any SDR to be interconnected to any antenna.

Figure 15:
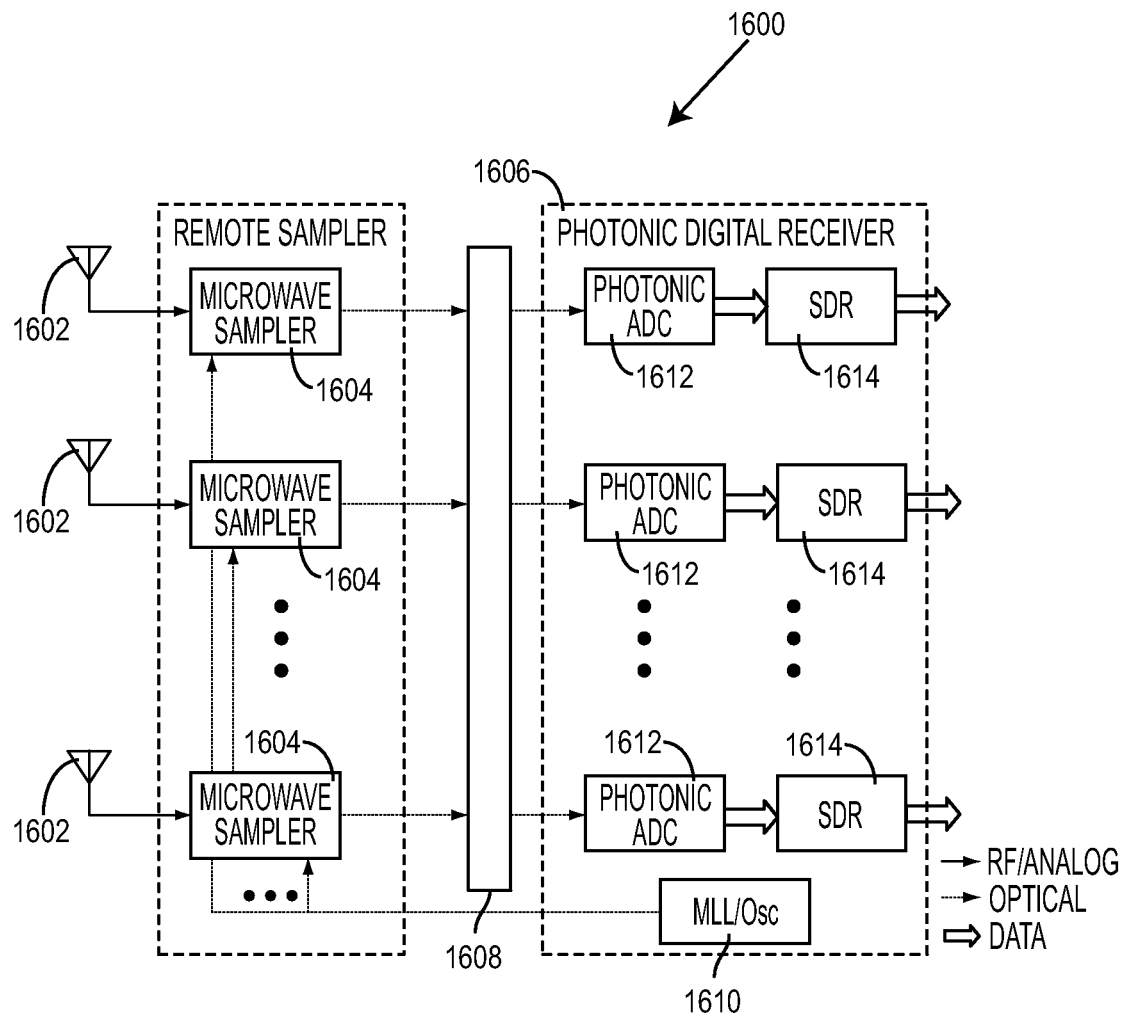
FIG. 15 is a photonic enabled software defined radio system, according to an exemplary embodiment.

Referring to FIG. 15, an optically-remoted system 1600 is illustrated according to an exemplary embodiment. An antenna 1602 receives a signal that is provided to a microwave sampler 1604 for transmission a digital receiver 1606 via an optical switch 1608. Because each receiver 1602 contains a pulsed-optical clock source 1610 operating at high frequency, there is no need for multiple oscillators at different frequencies. A high-repetition rate optical clock can sample any RF/Microwave signal (e.g., HF, VHF, X Band, etc.) at any antenna. The optically-modulated pulse stream is transported back to a pADC 1612 that directly converts the optical signal to a digital signal. An SDR 1614 then processes this digital signal. Depending on the bandwidth of the application, the resolution of SDR 1612 changes accordingly (e.g., narrow bandwidth applications may have higher resolution by virtue of oversampling). There are a number of advantages to this approach. Specifically this type of architecture lends itself to reducing the multiplicity of radio types while simultaneously enabling antenna reuse. The optical network has the benefits of low loss (e.g., a low noise figure), EMI resistance, and EMP resistance.

With the pADC technology, it is possible to achieve high-frequency, low-ENOB operation using low-ENOB eADCs and deserialization of the high-sampling-rate optical pulse stream. This technology may enable direct conversion of Ku band signals.

The pADC technology of deserialization and the development of a chip-scale MLL can be used in the development of very high-speed optical data network technologies. By reversing the deserializer in order to make a serializer, it is possible to modulate parallel streams of optical pulses and multiplex these pulses to create high-data-rate optical pulse streams for transport over a fiber-optical cable. In this case, the receiver will reverse the process by deserializing the data stream to a lower data rate that detectors and electronics can process.

The pADC technology can also benefit commercial telecom systems for 100 Gbps fiber optical systems and higher data rate systems on the order of several hundred Gbps. The pADC technology is relevant to the development of receivers for very high-data-rate fiber optical systems.

Free space optical systems can be developed based on mode-locked laser technology and the chip-scale optical switching technology. The modulation formats for such free space optical communications systems can be resistant to atmospheric turbulence. These systems may be beneficial to soldier systems, UAV applications, ship board systems, etc.

Higher real-time resolution made possible by new pADC systems may make radar image recognition/characterization systems more successful in accomplishing functions that the future war-fighter will need to understand his battle space. The push to higher bandwidth radars is seen on many fronts. While 3-meter resolution Synthetic Aperture Radar (SAR) systems were considered tactically useful a few years ago, new systems are being fielded with resolutions to 3 or 4 centimeters. On the short range front, classic coherent radars have been replaced by impulse systems with resolutions to 1 centimeter for a diverse set of applications. These include intruder detection, structural void detection in manufacturing and failure analyses/mechanical assessment. In the trend toward higher resolution, both transmitter and receiver bandwidths have continued to increase. At the highest bandwidths, analog methods of producing and processing waveforms are always first to reach new finer-resolution limits. The advances in digital processes produce a forcing function to increase the available bandwidth.

The conventional technology limit is producing conversion bandwidths at sufficient signal-to-noise ratio (SNR) to support both classic and novel radar applications. The pADC technology may enable system applications for digital processing that are not conventionally feasible. In material evaluation systems, current research using meta-material lenses is beginning to allow non-destructive RF evaluation of structures at resolutions finer than a wavelength. The planar resolution has not been matched in depth resolution. High speed ADCs with reasonable SNR may enable achieving the depth resolution needed for this evaluation technology. For example, an aircraft composite material evaluation may be performed using meta-material lenses.

While the detailed drawings, specific examples, detailed algorithms and particular configurations given describe preferred and exemplary embodiments, they serve the purpose of illustration only. The inventions disclosed are not limited to the specific forms shown. For example, the methods may be performed in any of a variety of sequence of steps or according to any of a variety of mathematical formulas. The hardware and software configurations shown and described may differ depending on the chosen performance characteristics and physical characteristics of the communications devices. For example, the type of system components and their interconnections may differ. The systems and methods depicted and described are not limited to the precise details and conditions disclosed. The figures show preferred exemplary operations only. The specific data types and operations are shown in a non-limiting fashion. Furthermore, other substitutions, modifications, changes, and omissions may be made in the design, operating conditions, and arrangement of the exemplary embodiments without departing from the scope of the invention as expressed in the appended claims.

What is claimed is:

1. A photonic analog to digital converter, comprising:
   one or more modulators configured to receive a first optical signal and a radio frequency signal, the one or more modulators configured to modulate the first optical signal based on the radio frequency signal; and
   at least one processor configured to independently provide one or more of phase, quadrature, and amplitude coordinates of a modulated signal from the one or more modulators, the processor providing the coordinates for one or more electronic analog to digital converters.

2. The photonic analog to digital converter of claim 1, wherein the one or more modulators comprises a phase modulator configured to modulate phase of the first optical signal based on the radio frequency signal.

3. The photonic analog to digital converter of claim 2, wherein the processor comprises one or more demodulators configured to receive a phase modulated optical signal from the phase modulator and to receive the first optical signal, the demodulator configured to demodulate the phase modulated optical signal and the first optical signal to provide the phase and quadrature coordinates, the demodulator providing the phase and quadrature coordinates for multiple electronic analog to digital converters of the one or more electronic analog to digital converters.

4. The photonic analog to digital converter of claim 3, wherein the processor further comprises:
   multiple demodulators of the one or more demodulators; and
   a deserializer coupled between the phase modulator and each demodulator and configured to provide the phase modulated optical signal and the first optical signal to each of the demodulators, each demodulator providing a demodulated output to a different electronic analog to digital converter of the one or more electronic analog to digital converters.

5. The photonic analog to digital converter of claim 3, wherein the processor further comprises multiple balanced detectors coupled to an output of the one or more demodulators.

6. The photonic analog to digital converter of claim 2, wherein the one or more modulators further comprise one or more amplitude modulators configured to modulate an amplitude of the first optical signal and to provide an amplitude modulated signal to an electronic analog to digital converter of the one or more electronic analog to digital converters through the processor.

7. The photonic analog to digital converter of claim 1, wherein the one or more modulators comprise one or more amplitude modulators configured to modulate an amplitude of the first optical signal and to provide an amplitude modulated signal to an electronic analog to digital converter through the processor of the one or more electronic analog to digital converters.

8. The photonic analog to digital converter of claim 7, wherein the processor comprises a deserializer configured to receive the amplitude modulated signal for output to multiple electronic analog to digital converters of the electronic analog to digital converters.

9. The photonic analog to digital converter of claim 8, wherein the processor further comprises balanced detectors coupled between the deserializer and the multiple electronic analog to digital converters.

10. The photonic analog to digital converter of claim 1, wherein the processor is configured to measure an RF induced optical phase angle rotation in phase and quadrature and/or to monitor an RF induced optical amplitude to track multiple phase rotations.

11. A photonic analog to digital converter system, comprising:
    one or more modulators configured to receive a first optical signal and a radio frequency signal, the one or more modulators configured to modulate the first optical signal based on the radio frequency signal; and
    at least one processor configured to independently provide one or more of phase, quadrature, and amplitude coordinates of a modulated signal; and
    multiple electronic analog to digital converters for receiving the coordinates from the processor and providing a digital signal output.

12. The system of claim 11, wherein the one or more modulators comprises a phase modulator configured to modulate phase of a first optical signal based on the radio frequency signal.

13. The system of claim 12, wherein the processor comprises one or more demodulators configured to receive a phase modulated optical signal and the first optical signal, the demodulator configured to demodulate the phase modulated optical signal and the first optical signals to provide the phase and quadrature coordinates.

14. The system of claim 13, wherein the processor further comprises:
    multiple demodulators of the one or more demodulators;
    a deserializer coupled between the phase modulator and each demodulator and configured to provide the phase modulated optical signal and the first optical signal to each of the demodulators, each demodulator providing a demodulated output to a different electronic analog to digital converter of the multiple electronic analog to digital converters; and multiple balanced detectors coupled to the multiple demodulators.

15. The system of claim 12, wherein the one or more modulators further comprise one or more amplitude modulators configured to modulate an amplitude of the first optical signal and output an amplitude modulated signal for an electronic analog to digital converter of the multiple electronic analog to digital converters.

16. The system of claim 11, wherein the one or more modulators comprise one or more amplitude modulators configured to modulate an amplitude of the first optical signal and output an amplitude modulated signal for an electronic analog to digital converter of the multiple electronic analog to digital converters.

17. The system of claim 16, wherein the processor comprises:

a deserializer configured to receive the amplitude modulated signal; and balanced detectors coupled between the deserializer and the multiple electronic analog to digital converters.

18. The system of claim 11, wherein the processor is configured to measure an RF induced optical phase angle rotation in phase and quadrature and/or to monitor an RF induced optical amplitude to track multiple phase rotations.

19. The system of claim 11, wherein the system operates with an effective number of bits that is larger than the effective number of bits of the individual components.

20. A converter for converting analog signals to digital signals, comprising:

means for receiving a first optical signal and a radio frequency signal, modulating the phase of the first optical signal based on the radio frequency signal and providing an optical modulated signal;

means for demodulating the optical modulated signal to provide multiple dimensions of the optical modulated signal, the multiple dimensions being amplitude, phase, or quadrature electronic dimensions; and means for electronically converting the dimensions into a digital signal.

21. An apparatus, comprising:

a receive circuit comprising:

a modulator configured to receive a first optical signal and a radio frequency signal, the modulator configured to provide an optical modulated signal based on the first optical signal and the radio frequency signal;

a processor configured to receive the optical modulated signal and provide an electronic demodulated signal representing a phase, quadrature or amplitude parameter; and a platform configured to receive the phase, quadrature or amplitude parameter associated with the electronic demodulated signal and provide an electronic digitized signal.

22. The apparatus of claim 21, wherein the modulator comprises a phase modulator configured to modulate a phase of the first optical signal based on the radio frequency signal and to provide a phase modulated optical signal as the optical modulated signal.

23. The photonic analog to digital converter of claim 22, wherein the processor comprises one or more demodulators configured to receive the optical modulated signal, the demodulator configured to demodulate the optical modulated signal to provide phase and quadrature coordinates as the phase and quadrature parameters.

* * * * *